United States Patent
Kadatsky et al.

(10) Patent No.: US 6,381,155 B1
(45) Date of Patent: Apr. 30, 2002

(54) METHOD FOR CLUSTERIZED POWER SHARING CONVERSION AND REGULATION OF THE PRIMARY POWER SOURCE WITHIN A CONVERTING AND REGULATING POWER SUPPLY, AND SYSTEM

(75) Inventors: Anatoly F. Kadatsky; Eugene V. Karpov; Naum I. Volovets, all of South San Francisco, CA (US)

(73) Assignee: Next Power Corporation, South San Francisco, CA (US)

( * ) Notice: Subject to any disclaimer, the term of this patent is extended or adjusted under 35 U.S.C. 154(b) by 0 days.

(21) Appl. No.: 09/578,180

(22) Filed: May 23, 2000

(Under 37 CFR 1.47)

(51) Int. Cl.[7] .............................. H02M 3/158
(52) U.S. Cl. ...................................... 363/65
(58) Field of Search ..................... 363/65, 67, 71; 323/282, 351; 307/58, 82

(56) References Cited

U.S. PATENT DOCUMENTS

| | | | | |
|---|---|---|---|---|
| 4,034,232 A | * | 7/1977 | LaVenture | 307/32 |
| 4,150,425 A | * | 4/1979 | Invention | 363/56 |
| 4,174,534 A | * | 11/1979 | Kotlarewsky | 363/26 |
| 4,276,590 A | * | 6/1981 | Hansel et al. | 363/71 |
| 4,290,101 A | * | 9/1981 | Hergenhan | 363/65 |
| 4,323,959 A | * | 4/1982 | Check | 363/40 |
| 4,609,828 A | * | 9/1986 | Small | 307/44 |
| 4,648,020 A | * | 3/1987 | Vinciarelli | 363/71 |
| 4,695,933 A | * | 9/1987 | Nguyen et al. | 363/17 |
| 4,725,940 A | * | 2/1988 | Henze | 363/72 |
| 4,814,963 A | * | 3/1989 | Petersen | 363/20 |
| 4,843,534 A | * | 6/1989 | Taddeo et al. | 363/71 |
| 4,843,535 A | * | 6/1989 | Fuchs | 363/71 |
| 4,853,832 A | * | 8/1989 | Stuart | 363/17 |
| 4,924,170 A | * | 5/1990 | Henze | 323/272 |
| 5,036,452 A | * | 7/1991 | Loftus | 363/71 |
| 5,079,686 A | * | 1/1992 | Vinciarelli | 363/15 |
| 5,266,838 A | * | 11/1993 | Gerner | 307/19 |
| 5,436,512 A | * | 7/1995 | Inam et al. | 307/58 |
| 5,473,528 A | * | 12/1995 | Hirata et al. | 363/71 |
| 5,604,669 A | * | 2/1997 | Strong, III | 363/17 |
| 5,682,303 A | * | 10/1997 | Goad | 363/71 |
| 5,694,309 A | * | 12/1997 | Prager et al. | 363/65 |
| 5,740,023 A | * | 4/1998 | Brooke et al. | 363/65 |
| 5,834,925 A | * | 11/1998 | Chesavage | 323/272 |
| 5,875,104 A | * | 2/1999 | Prager | 363/65 |
| 5,905,645 A | * | 5/1999 | Cross | 363/65 |
| 5,945,815 A | * | 8/1999 | Elliott | 323/269 |
| 5,959,441 A | * | 9/1999 | Brown | 323/282 |
| 5,973,485 A | * | 10/1999 | Kates et al. | 323/272 |
| 6,009,000 A | * | 12/1999 | Siri | 363/21 |

* cited by examiner

Primary Examiner—Adolf Deneke Berhane
(74) Attorney, Agent, or Firm—Ray K. Shahani, Esq.

(57) ABSTRACT

A method for clusterized power sharing conversion and regulation of the primary source power within the power converting and regulating supplies includes performing simultaneously and indispensably a procedure of subdividing every switch-mode power conversion process into multiples of sub-processes, each performed with a less intensive power draw within a separate power conversion channel, a procedure of time-displacing these sub-processes and a procedure of overlaying the power shares drawn through the separate power conversion channels. When applied to the power supply systems these procedures are performed within the summing circuits between primary power sources and power converting apparatus and loads. The improved method offers a procedure of subdividing the multiple power conversion power-on cycles into a number of separate clusters each containing at least one or more power-on cycles, a procedure of time-displacing the clusterized power-on cycles with respect to each other within the same cluster, a procedure of summing the portions of power drawn through the same cluster, a procedure of time-displacing the clusters, a procedure of summing the shares of power drawn through all clusters, and a procedure of controlling the time-displacement intervals to provide optimal superimposition of power shares drawn through the system which results in improvement of ripple filtering, efficiency and rate-of-response to changes in load.

59 Claims, 30 Drawing Sheets

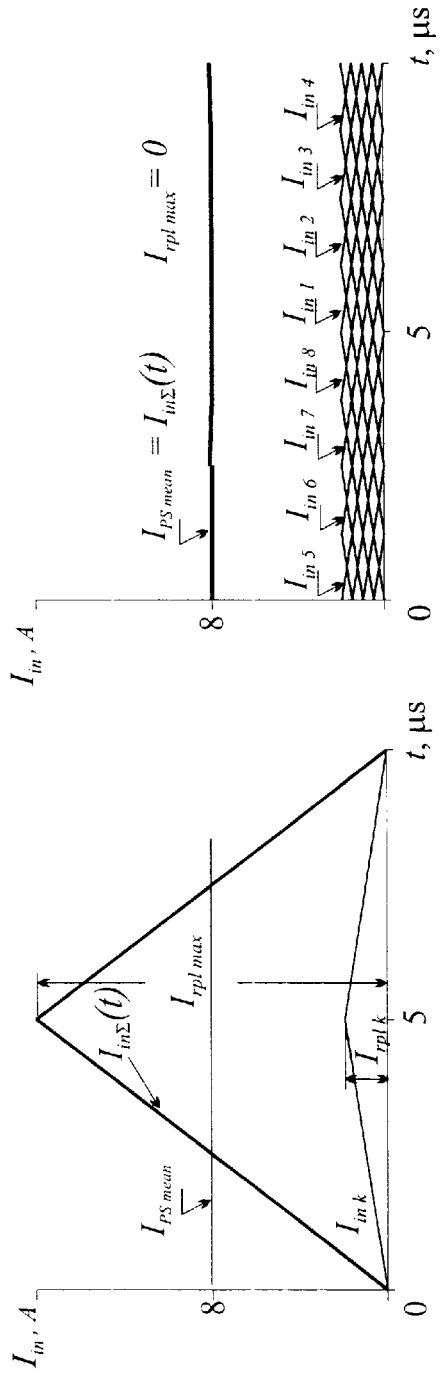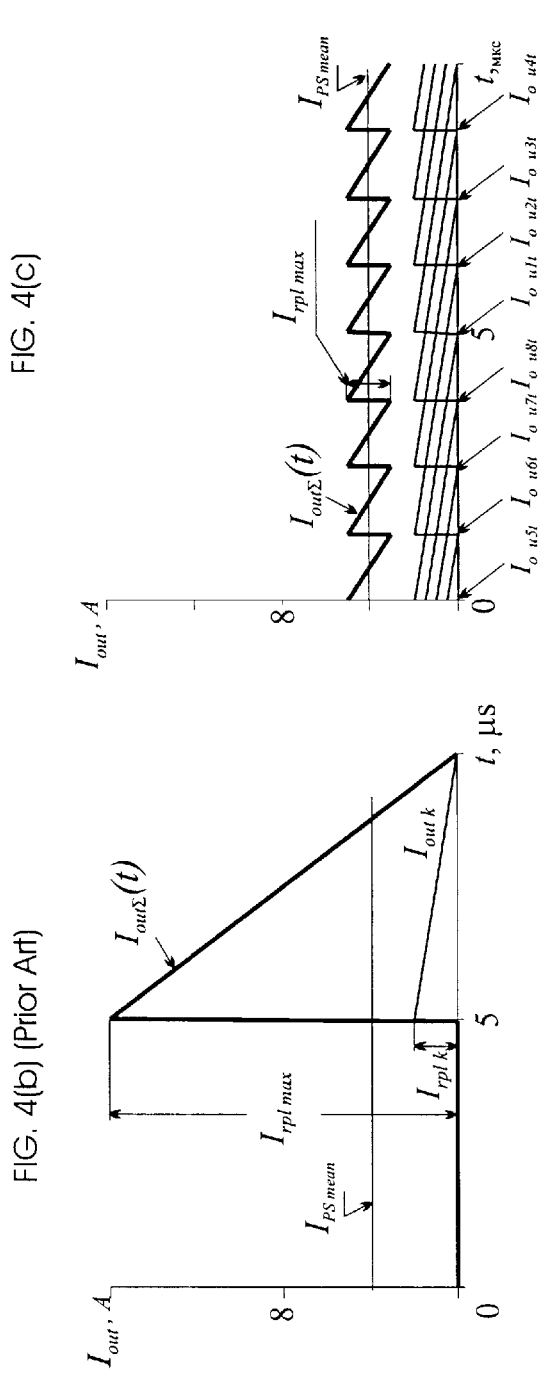

Syn-Phase Mode

FIG. 8 (a) (Prior Art)

Poly-Phase Mode $\Delta I_{out2} = +30\%$

FIG. 8 (c) (Prior Art)

$\Delta L_2 = -30\%$

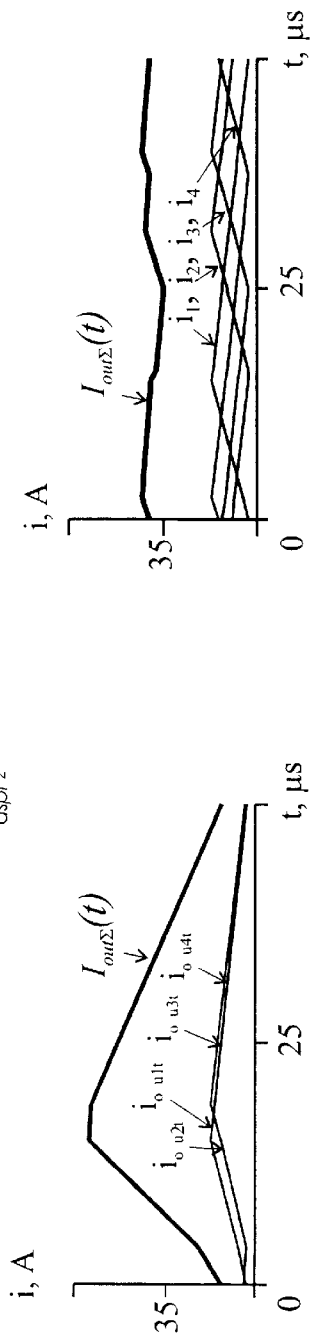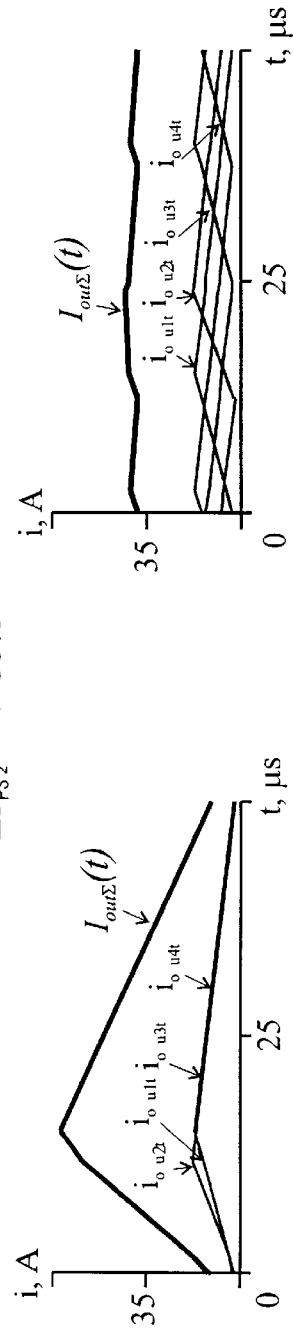

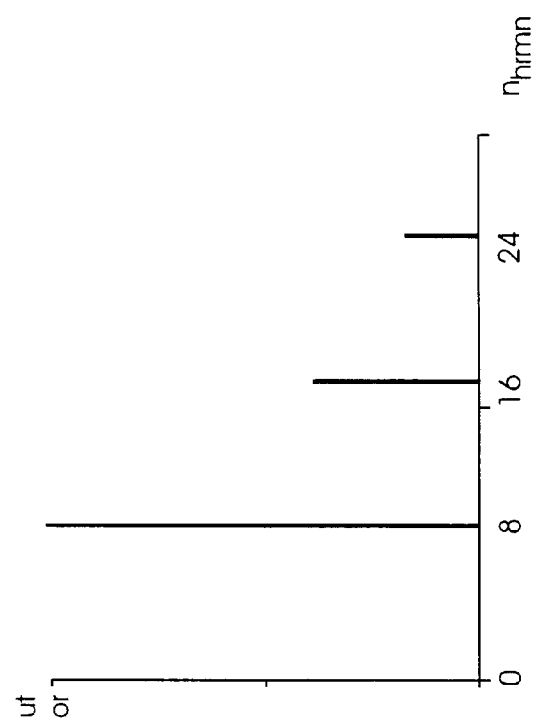

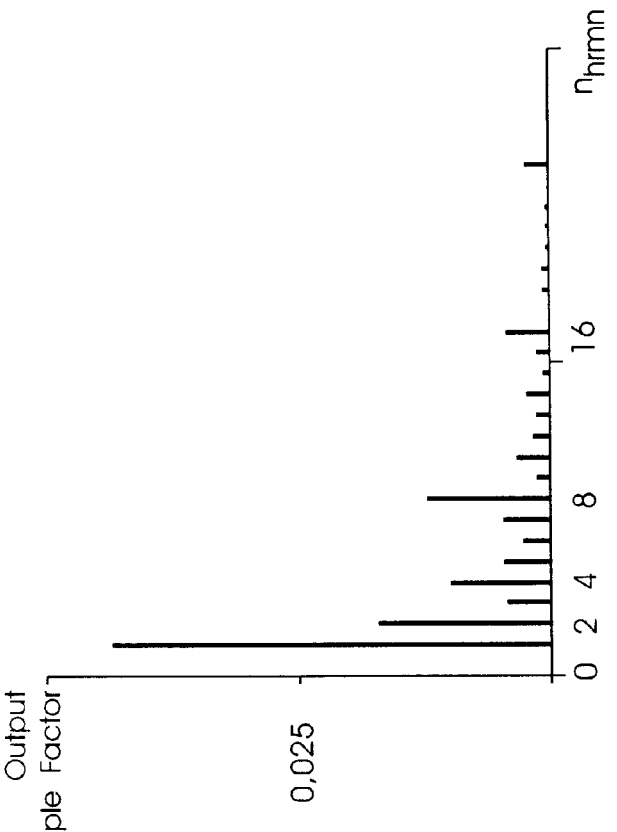
FIG. 9 (d)
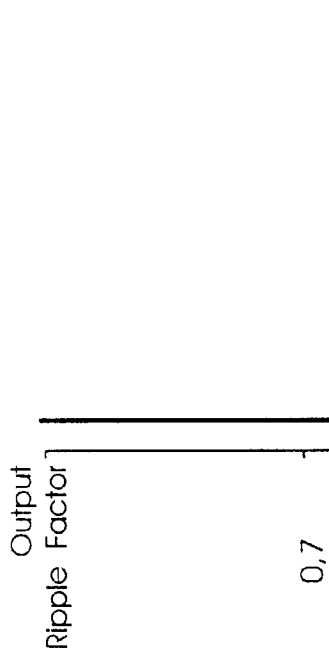
FIG. 9 (C) (Prior Art)

METHOD FOR CLUSTERIZED POWER SHARING CONVERSION AND REGULATION OF THE PRIMARY POWER SOURCE WITHIN A CONVERTING AND REGULATING POWER SUPPLY, AND SYSTEM

FIELD OF THE INVENTION

The invention relates to the field of DC to DC power conversion systems and provisions for making optimal use of the system described in conjunction both with the primary DC power sources available and the given loads power consumption demands.

BACKGROUND OF THE INVENTION

The DC power converters which convert power from a primary DC power source into an output DC power draw defined by the load power consumption demands have become widely popular for feeding the electric and electronic circuits of varied devices. A great variety of DC-DC converter designs and circuitry have been invented and are used to address the variety of applications and requirements. Most common DC-DC converter designs were based on a primary power inductor or transformer, at least one switching transistor and an output filter capacitor. However, these prior art designs appear with large number of parts of substantial weight, volume and power losses, and with a limited power conversion density, i.e., the ratio of the number of watts per cubic inch or in regards to the overall cost. Attempts to increase the power conversion density by increasing the operational frequency have been ineffective. Primarily this is because proportional increases in power losses result in heat retention which undermine component reliability.

To overcome these disadvantages, a number of multiple converter topologies have been developed to improve power conversion density and overall power conversion performance. These are power sharing techniques which utilize multiple in-parallel arranged DC power converter units that are relatively small size. Each converter unit delivers only portions of the overall drawn power. Moreover, it is cost effective to design and manufacture standardized individual power converter units that combine into an array to feed a particular load, rather than to design and manufacture specific DC power converters to fit each application.

The power sharing DC-DC power conversion system includes at least one DC primary source, a multi-channel DC-DC power converter and a load. The multi-channel DC-DC power converters may be of any existing topology provided that it contains multiple internal switch-mode power conversion channels. The early prior art designs provide simultaneous operation of paralleled power conversion units. For multi-channel DC-DC power converter this means that each internal channel delivers its portion of power from a DC primary source to a load in a synchronously coincidental mode of operation (syn-phase, provided that all power conversion channels have a common operating frequency to trigger power-on cycles.

In a syn-phase mode of power conversion, all internal channels operate synchronously and simultaneously to each other. This synchronous operation creates large instantaneous power draws and large drops in the voltage of the primary power source. This instantaneous draw creates additional problems by introducing substantial input and output ripple. The ripple is caused by the simultaneous overlay of similar non-linear responses within corresponding circuits due to the non-linearity of any power conversion process.

Different multi channel converter configurations introduce different ripple constituents. In the case of parallel combined inputs and outputs, the input and output currents are summed within respective input and output circuits. The amplitude of the resultant primary source voltage drops increases proportionally to the N number of combined inputs. The resultant consumption and delivery currents have N times multiplied direct and ripple constituents as compared to the single power conversion channel.

In the case of series combined input and/or output power conversion channels circuits, the amplitude of the primary source voltage drop increases proportionally to the number of combined inputs. The resultant delivery voltage has N times multiplied direct and ripple constituents as compared to the same single power conversion channel.

Another disadvantage of the syn-phased power conversion is very slow response to changes in load. The time required responding to a change in load is limited to no less than one switching frequency period. In addition, the feedback circuit (used to control the power-on cycle interval) rate-of-response is severely limited to avoid feedback loops excited by ripple constituents.

Since all converters of the system have a common operating frequency, it was therefore determined reasonable to control the individual converters through staggered timing of their power-on cycles, i.e. in a poly-phase mode. In this way a power demand is also staggered over time eliminating the huge drops in primary power.

In poly-phase mode power, all channels operate with their power-on cycles time-staggered so, that there is a time displacement, $\Delta t_{dspl}$, interval between the start-on points of the sequential cycles. Provided that all power conversion channels have the same operating frequency, the resultant summed input and output power draws show substantial improvement from the standpoint of primary power stress and output ripple constituents. Summing the time-staggered portions of converted power produces a filtering effect within the input and output circuits of the combined power conversion channels.

Since all the converters are driven out-of-phase in respect to each other, their non-linear responses are superimposed in a non-simultaneous and non-coincidental order. The result is a staggered inter-related compensation of overlapped portions of non-linear responses. This overlap decreases the non-linearity of the summed power draw.

It is therefore recognized inappropriate to increase the output power draw by increasing the number of parallel syn-phased power conversion channels since it produces proportional increase of input and output ripple constituents. However, increasing the number of poly-phased power conversion channels produces substantial decrease of input and output ripple constituents as compared with a single power conversion channel in the row.

However, the relative advantages of the prior art poly-phase mode power conversion approach do not provide completely satisfactory solutions to DC-DC power conversion.

There are many different applications requiring to deliver high quality DC power to a multiple loads from multiple low quality primary power sources. These varied applications make it desirable to have a modular power conversion system where small conversion units are combined in a single unit where their joint operation produces both a high quality and low loss power transfer from power source load demands.

It is evident that securing the high quality features of poly-phase power sharing DC-DC power conversion within the complex system configurations comprised of multiple primary power sources, DC-DC converters and loads may need more sophisticated control arrangement for operating the technical means. Thus, a better method and apparatus for power sharing techniques is needed.

ADVANTAGES AND SUMMARY OF THE INVENTION

The benefits of the proposed invention may be better disclosed through a comparative appraisal of the syn-phased versus poly-phased multi-channel power conversion systems.

The syn-phased power sharing DC-DC power conversion system, as shown at FIG. 1(*a*), includes at least one DC primary source 10, a multi-channel DC-DC power converter 12 and a load 14. The multi-channel DC-DC power converters 12 may be of any existing topology provided that it contains multiple switch-mode power conversion channels 16. Each internal channel 16 delivers its portion of power from DC primary source 10 to a load 14 in a synchronously coincidental (syn-phase) mode of operation. Syn-phase operation assumes all power conversion channels have common operating frequency for power-on cycles.

In a syn-phase mode of power conversion, all power conversion channels 16, as shown at FIG. 3(*a*), operate synchronously and simultaneously to each other. This coincidental operation creates large instantaneous power draws and large drops in the voltage of the primary power source with substantial input and output ripple. The ripple is caused by the simultaneous overlay of similar non-linear responses from all conversion channels. This is due to the non-linearity of any power conversion process.

In the case of parallel combined inputs and outputs, as shown at FIG. 2(*a*) and for boost power conversion channels with pulse width modulation control at FIG. 4(*a*) or for bridge-type resonant channels at FIG. 5(*a*), the input and output currents are summed within respective input and output circuits. The amplitude of the resultant primary source voltage drops increases proportionally to the number of combined inputs. The resultant consumption and delivery currents have N times multiplied direct and ripple constituents as compared with the single power conversion channel, as shown at FIG. 4(*b,d*) and FIG. 5(*b*).

In the case of series combined input and/or output power conversion channel circuits, as shown at FIG. 2(*b,c,d*) and for free running full-wave power conversion channels at FIG. 6(*a*), the amplitude of the primary source voltage drop increases proportionally to the number of combined inputs. The resultant delivery voltage has N times multiplied direct and ripple constituents as compared to the same single power conversion channel, as shown at FIG. 6(*b*).

In a poly-phase mode of power conversion all channels, as shown at FIG. 3(*b*), operate with their power-on cycles time-staggered so, that there is a $\Delta t_{dspl}$ interval between the start-on points of the sequential cycles. Provided that all power conversion channels have similar operating frequency, the resultant summed input and output power draws show substantial improvement from the standpoint of primary power stress and output ripple constituents. Summing the time-staggered portions of converted power produces a filtering effect within the input and output circuits of the combined power conversion channels, as shown at FIG. 4(*c,e*), 5(*c*) and 6(*c*).

Referring to FIG. 7(*a,b,c,d*), increasing the output power draw by increasing the number of parallel syn-phased power conversion channels produces a proportional increase of input and output ripple constituents. Conversely, increasing the number of poly-phased power conversion channels produces substantial decrease of input and output ripple constituents as compared with a single power conversion channel in the row.

The filtering efficiency achieved through poly-phasing the power conversion channels depends, though less substantially compared to the syn-phased method, on the interrelated symmetry, i.e. sameness of their internal electrical properties.

Referring to FIG. 8(*a,c,e,g*), the summed output current waveforms of four combined syn-phased power conversion channels depend on how well the core electric parameters match and on the main component values within the channels. A significant change of output current waveform shape is evident when a mismatch within any channel occurs. However, as shown in FIG. 8(*b,d,f,h*), the same mismatch in electrical parameters produces a substantially less significant impact to the shape of the summed output current waveforms when operated in a poly-phase mode.

Referring to FIG. 9(*a,c,e,g,i*), for eight combined in common syn-phased power conversion channels, the highest output ripple factor corresponds to a harmonic n=1 when a mismatch of any core parameters within any channel occurs.

Referring to FIG. 9(*b,d,f,h,j*), the same combined channels, operated in a poly-phased mode, produce a substantially reduced output ripple factor for n=mN (N=8 and m=1,2, . . . ) harmonic numbers and close to zero values of output ripple factor for n≠mN harmonic numbers depending on the degree of non-similarity of core electrical parameters within any channel.

Nevertheless, combining the power converting units into the complex configurations according to the existing needs may decline and undermine the advantages provided by the poly-phased power sharing approach to power conversion system configuring.

Exploring the of DC-DC power conversion system configuration shown on FIG. 1(*b*), wherein:

- every DC-DC power converter 12 includes four internal power conversion channels 16 operated in a poly-phase mode,
- every DC-DC power converter 12 includes one internal power conversion channel 16 affected by a random inner mismatch of interrelated time-displacement $\Delta t_{dspl}$ in accordance with condition pointed for FIG. 8(*f*),
- every DC-DC power converter 12 outputs the resultant current $I_{out\Sigma}(t)$ as shown on FIG. 8(*f*), with ripple decreased as compared with the same of a single internal power conversion channel 16,
- all three DC-DC power converters 12 are synchronously operated in a simultaneous, i.e. syn-phase mode,
- therefore all three output resultant currents $I_{out\Sigma}(t)$ and their persistent residual ripples are coincidently superimposed within the load 14 producing the totalized output current $\Sigma I_{out\Sigma}(t)$, as shown on FIG. 8(*j*), with residual output ripple back multiplied and poly-phase mode advantages lost.

The same consideration is evidently valid for other complex DC-DC power conversion system configurations.

As shown on FIGS. 2(*a,b,c,d*), there are four different arrangements for combining in common the inputs and outputs of power conversion channels 16.

FIG. 2(*a*) is a block diagram of parallel-to-parallel power conversion channels 16 configured to deliver higher DC output current with the same DC output voltage that is delivered by a single unitary power conversion channel 16.

FIG. 2(b) is a block diagram of parallel-to-series power conversion channels 16 configured to deliver higher DC output voltages than can be delivered by a single power conversion channel 16.

FIG. 2(c) is a block diagram of series-to-series power conversion channels 16 configured to handle higher DC input voltages than can be handled by a single power conversion channel 16 and to deliver higher DC output voltages that can be delivered through a single power conversion channel 16.

FIG. 2(d) is a block diagram of series-to-parallel power conversion channels 16 configured to handle higher DC input voltages than can be handled by a single power converter and to deliver higher output power that can be delivered through a single power conversion channel 16.

The prior art poly-phased multi-channel DC-DC power conversion systems deliver an enormous increase of converted power draw compared with ordinary single channel converters. Nevertheless, it is not possible to increase the high quality power draw by simply increasing the number of power conversion channels added in parallel and included in the time-staggered chain.

The benefits of the poly-phase operation of multiple power conversion channels arise from the fact that the sequential power-on cycles are non-coincidental and also from the fact that the non-linear responses of the sequential power-on cycles overlap each other when being summed as portions of power draw.

It is well known from the science of system control that any technical object exhibits inertial properties when being forced to change from a stable state. The same concerns apply to power conversion channels. Activating the power-on cycle of power conversion is not short enough in time and the rise time interval between receiving the activating pulse from the control circuit and reaching the pre-selected rate-of-conversion should be taken into account. Thus, to secure a reliable non-coincidence of the sequential power-on cycles, the shortest interval of time between the sequential start-on points of power-on cycles should not be shorter then the longest interval of any channel within the power conversion system. In a contrary, the sequential power conversion cycles may casually coincide due to variations of individual rise time intervals and therefore exhibit a pseudo-syn-phase mode of operation while loosing all benefits of poly-phase mode of power conversion. It is evident that the number of power conversion channels included in a poly-phase chain should not exceed a certain number and this is the most significant limitation of the prior art poly-phase power conversion systems, which may be expressed as:

$$N_{max} < T/\tau_{max},$$

where $N_{max}$ is number of power conversion channels in a poly-phase chain,

T is the period of the switch-mode operation frequency, $\tau_{max}$ is the longest rise time interval of any channel within the poly-phase chain.

The rise time interval $\tau$ also contributes to the limitation of general rate-of-response to changes in load and cannot be reduced beneath the value determined by physical bounds and the properties of existing art.

The purpose of this invention is to eliminate the limitations to increasing the converted power draw through increasing the number of power conversion channels included in a DC-DC power conversion system.

The further purpose of this invention is to improve the filtering efficiency of poly-phase mode DC-DC power conversion systems.

The further purpose of this invention is to eliminate the limitations for increasing the rate-of-response to changes in load within multi-channel DC-DC power conversion systems.

The quality of poly-phase power sharing in the DC-DC power conversion process, i.e. primary source stress, ripple contents and rate-of-response to a stepping load, depend exclusively on the extent to which the separate portions of drawn power compensate each others non-linear responses when being overlapped within the corresponding summing circuits.

The prior art poly-phase DC-DC power conversion methodologies are based on a single-chain of time-staggered power-on cycles of multiple power conversion channels. With prior art methodologies, smoothing the summed power draw relies on the overlay of said non-linearities. and do not provide the opportunity for their optimal regulation.

The improvement of the proposed invention is that the multiple power conversion channels are subdivided into a number of groups for bunching the in-group chained time-staggered power-on cycles of in-group arranged power conversion channels. The process provides a number of group based power-on cycle staggered chains within a power conversion system. Each group provides a cluster of time-staggered power-on cycles, i.e. power-on cluster.

The advantage of the proposed invention is that the time-staggered power-on cycles within a group may be adjusted for optimal compensation of non-linearities of the power segments processed by the in-group arranged power conversion channels, i.e. within a cluster. The result is a less non-linear power draw, i.e. power-on cluster draw.

The additional improvement of the invention is that the established groups, in their turn, are combined in common for the chained time staggering of the power-on clusters. This process allows the time-staggered power-on clusters to be adjusted for optimal compensation of non-linearity in the power-on cluster outputs, providing additional smoothing and improvement of overall power draw.

The additional advantage of the invention is that the number of power-on clusters, i.e. number of groups, number of power conversion channels, and amount of processed power may be increased as compared to prior art.

The invention further improves the DC to DC power conversion in that the chain-staggered power-on clusters each have a separate feedback loop. The locally distributed feedback loops provide better sensitivity and faster response time to changes in load and other random mismatches.

The further improvement of the invention is that power-on clusters may be combined into various configurations to adapt to the profile of the primary power source systems such as multi-source primary systems, and to the profile of the existing loads, such as a multi-load system.

The further advantage of the invention is that, due to the chain-staggered cluster approach, the high-linear power consumption may be secured for any configuration of primary power source and high-linear power delivery may be secured for any configuration of loads.

The clusterized poly-phase mode of power conversion may be used within the power supply systems shown at FIG. 1(a,b,c).

When, according to the prior art, the time-displacement exists only between the power-on cycles of unitary channels 16 within every modular converter 12 and no time-displacement exists between the power-on cycles of power converters 12 themselves, then the primary power sources and loads experience the syn-phase mode of superimposing the clusters of poly-phased channels 16 responses, as described above and with summed output current $\Sigma I_{out\Sigma}(t)$ shown on FIG. (8j) persisting multiplied residual ripple.

When, according to the prior art, the time-displacement exists only between the power-on cycles of modular converters 12 and no time-displacement exists between the power-on cycles of unitary channels 16 then both primary power sources and loads experience the poly-phased mode of superimposing the clusters of syn-phased channel 16 responses, and the totalized output current $\Sigma I_{out\Sigma}(t)$ may look quite similar to shown on FIG. 8(j) persisting large residual ripple.

When, according to the invention, the time-displacement exists both between the power-on cycles of the power channels 16 within every modular converter 12 and between the power-on clusters of modular converters 12, as shown on FIG. 8(i), then the primary power sources and loads all experience the poly-phased mode of power conversion and any non-linearity of overall power conversion draw may be compensated through a superimposition adjustment both within and between the power-on clusters, and therefore the summed output current $\Sigma I_{out\Sigma}(t)$ as is shown on FIG. 8(i) with the summed residual ripple decreased.

The quality properties of the prior art poly-phase power sharing conversion techniques are based on setting up constant values for time-displacement $\Delta t_{dspl}$ between the start-on points of the power-on cycles involved in a single-chain time-staggering, i.e.:

$$\Delta t_{dspl} = T/N = \text{const},$$

where T is the period of common operating frequency and N is the number of power-on cycles. Therefore, the process of superimposing the portions of converted power is rigid by nature and therefore the opportunities for improving the quality of the overall power draw is limited.

The further improvement of this invention is that variable values for interrelated time-displacement between the start-on points of the power-on cycles involved in a single-chain time staggering may be set up, i.e.:

$$0 < \Delta t_{dspl} \leq T/N,$$

and variable values for interrelated time-displacement between the start-on points of power-on clusters may be set up, i.e.:

$$0 < \Delta t_{dspl} < T/M,$$

where M is the number of clusters.

The above illustrates the further advantage of the clusterized poly-phase mode of power conversion in that a wide range of flexibility and power conversion efficiency is provided in adjusting for optimal compensation of non-linearity in the process of summing the portions of converted power.

Figure 5:
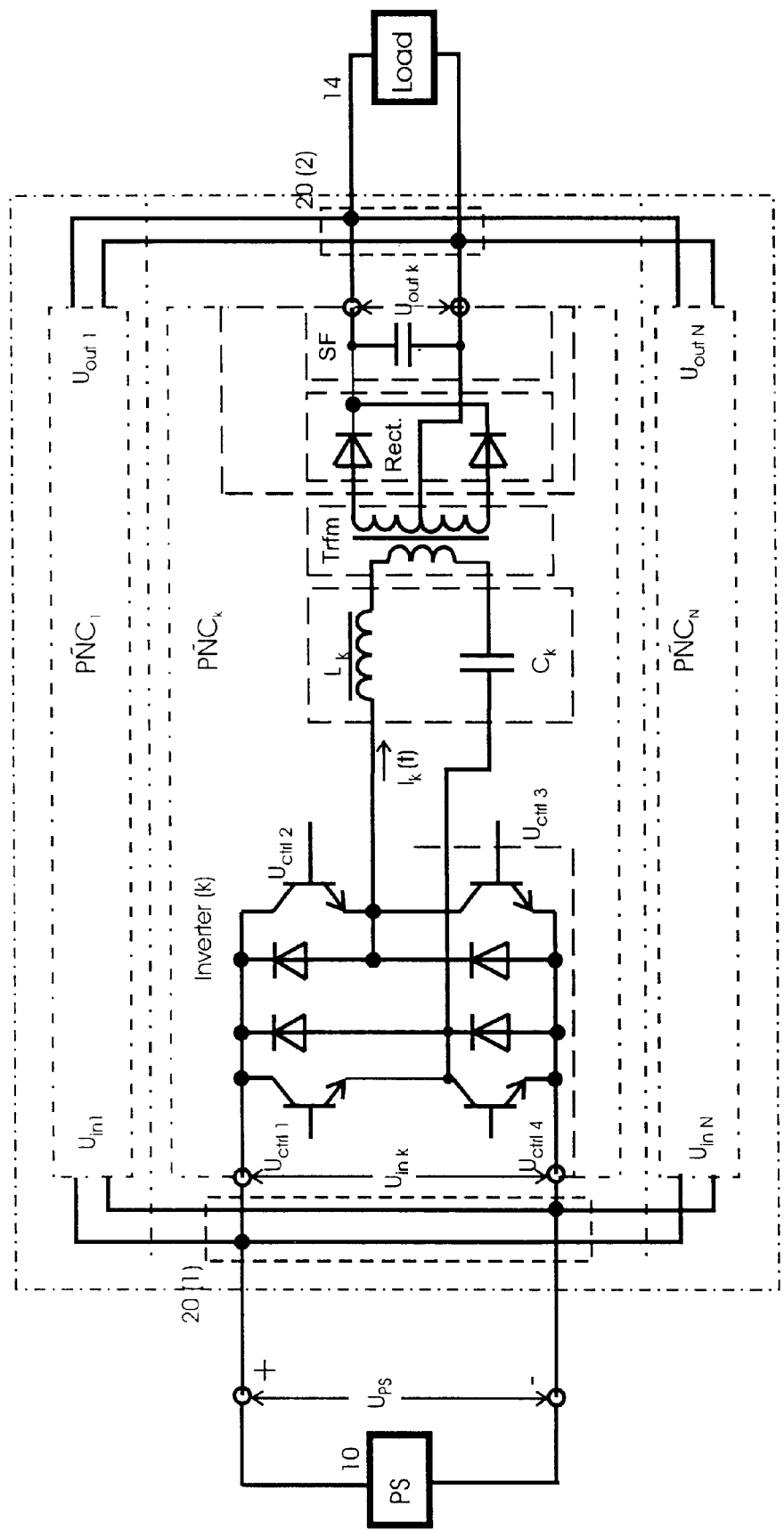
Figure 5:
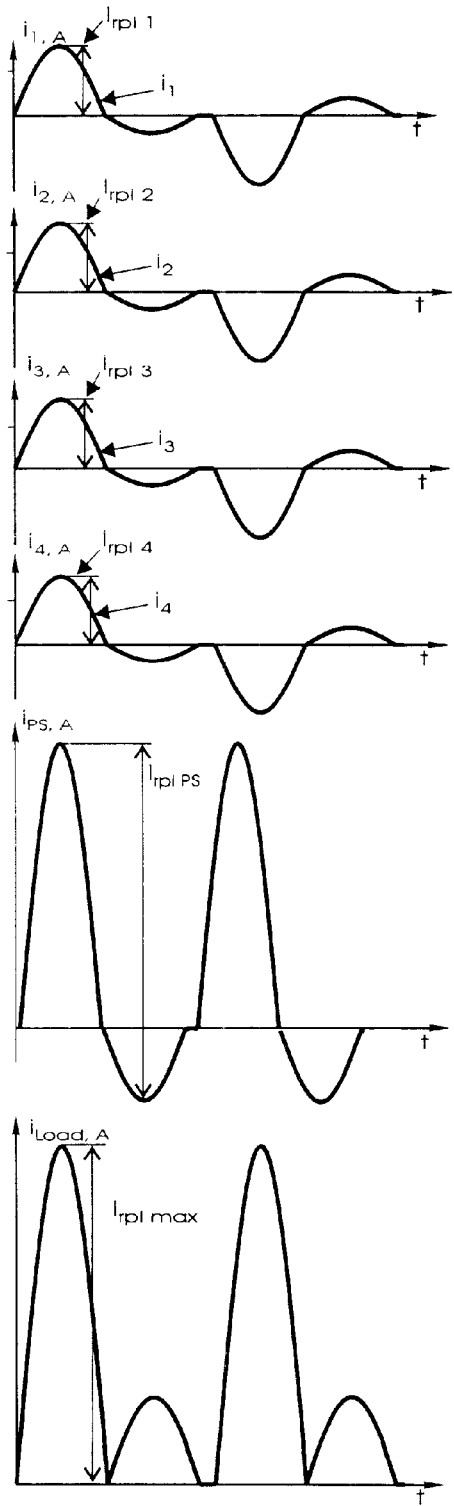
Figure 5:
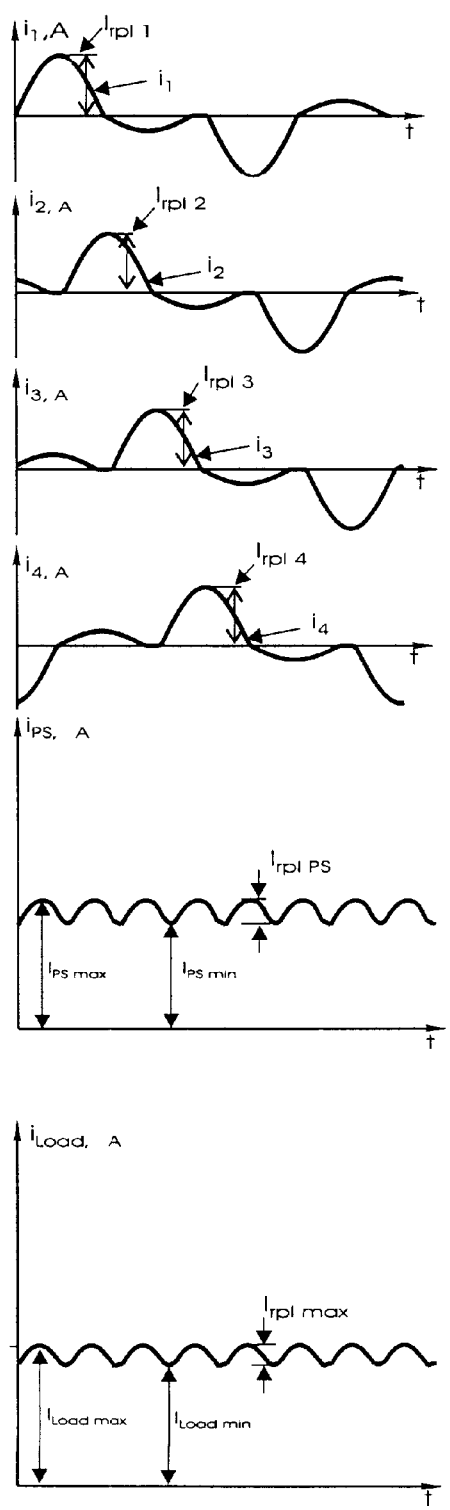

a schematic diagram (a), the timing diagrams for syn-phase (b,d) and poly-phase (c,e) modes of conversion;

FIG. 5(a)–(c) illustrates a principle of DC-DC power conversion through modular bridge-type resonant power conversion channels:

a schematic diagram (a), the timing diagrams for syn-phase (b) and poly-phase (c) modes of conversion.

Figure 6:
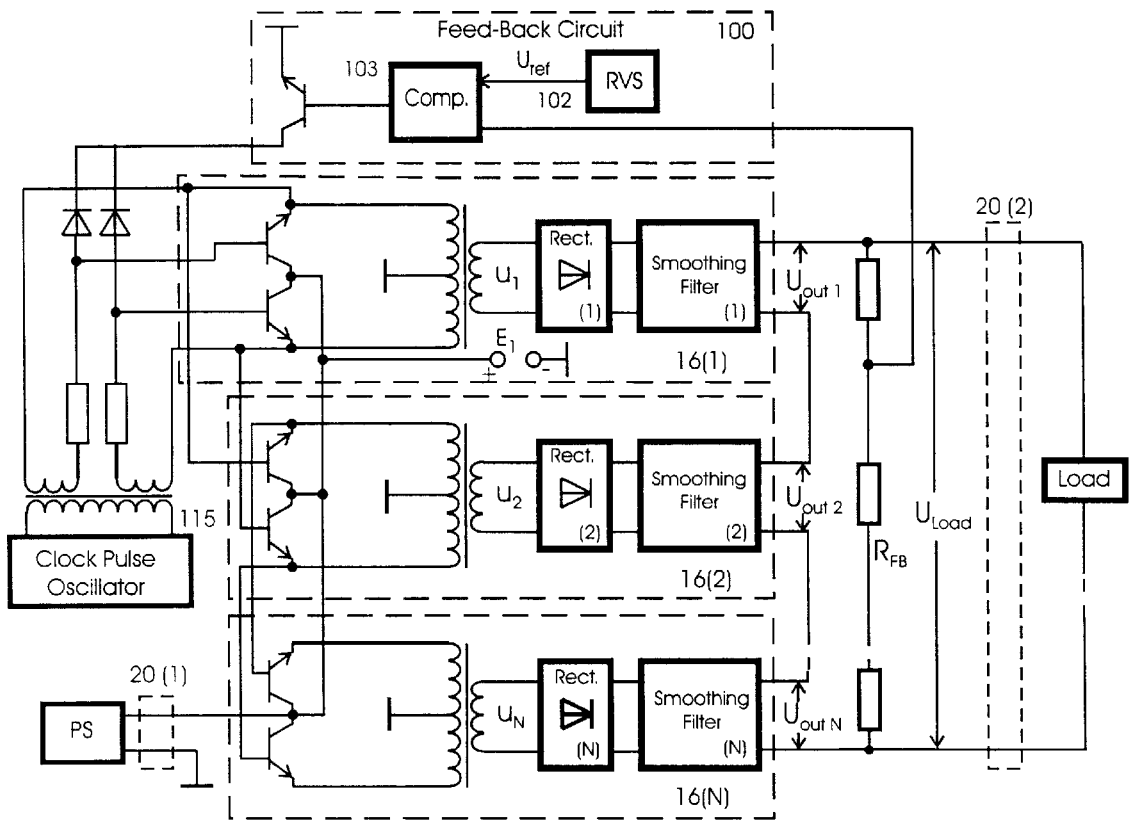
Figure 6:
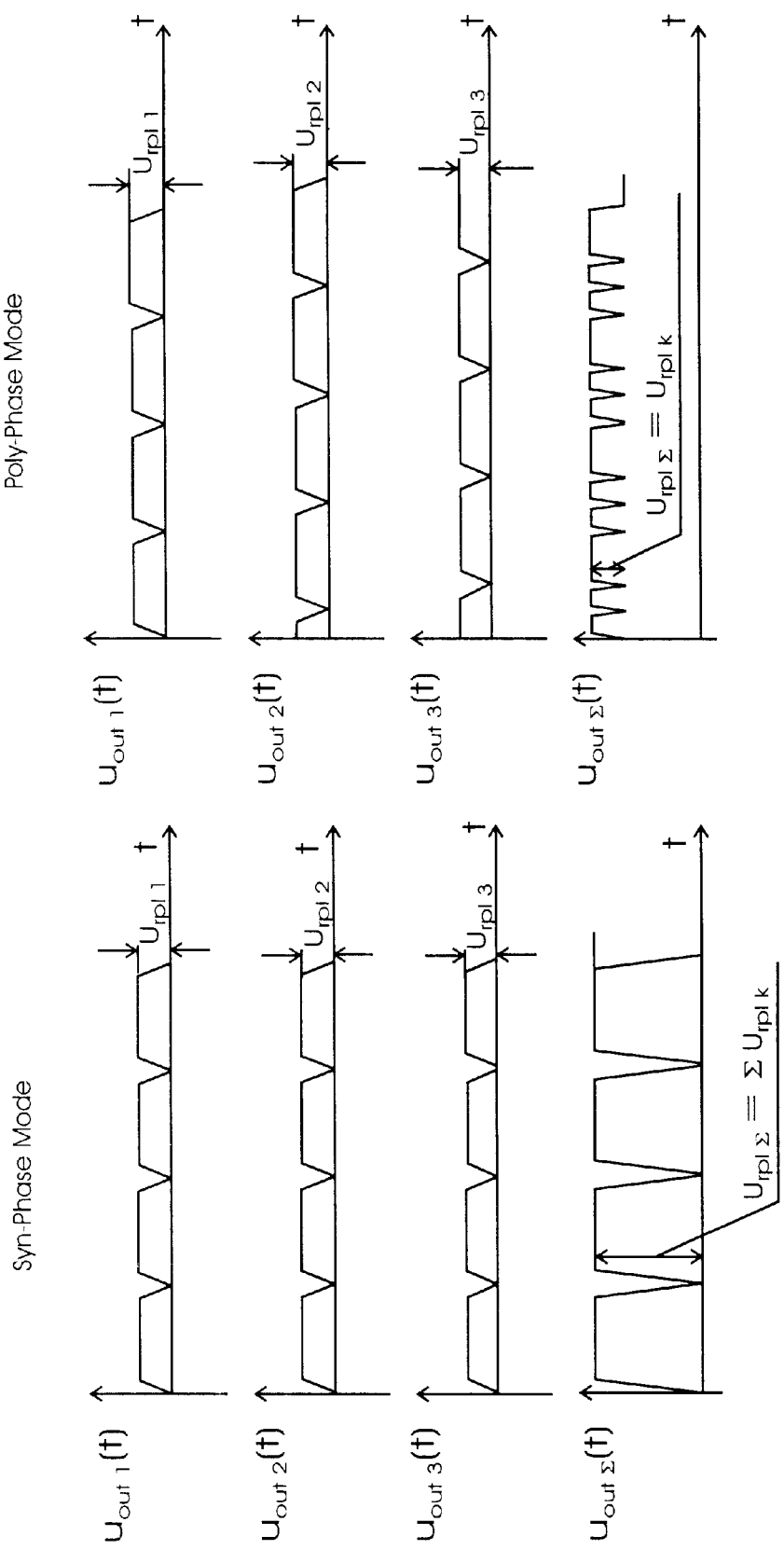
Figure 7:
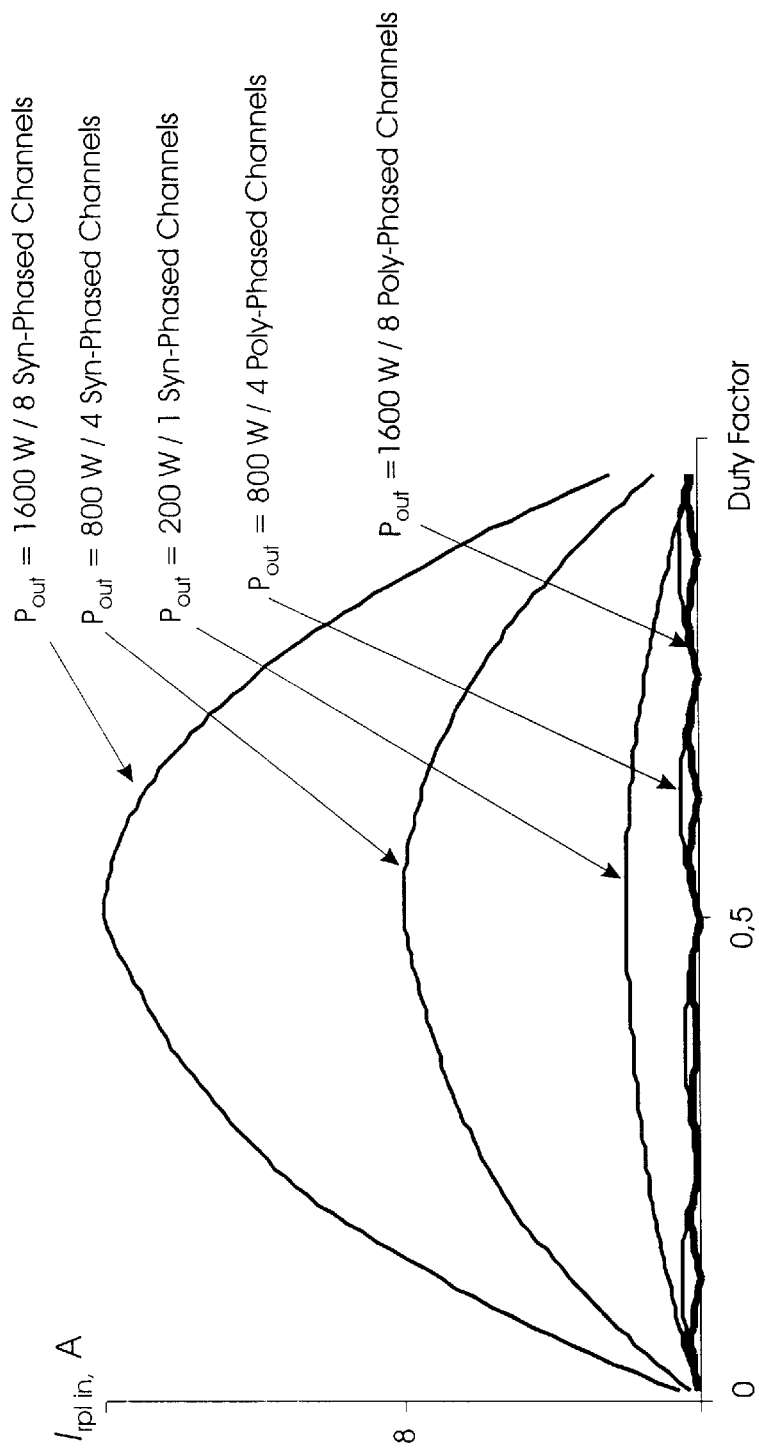
Figure 7:
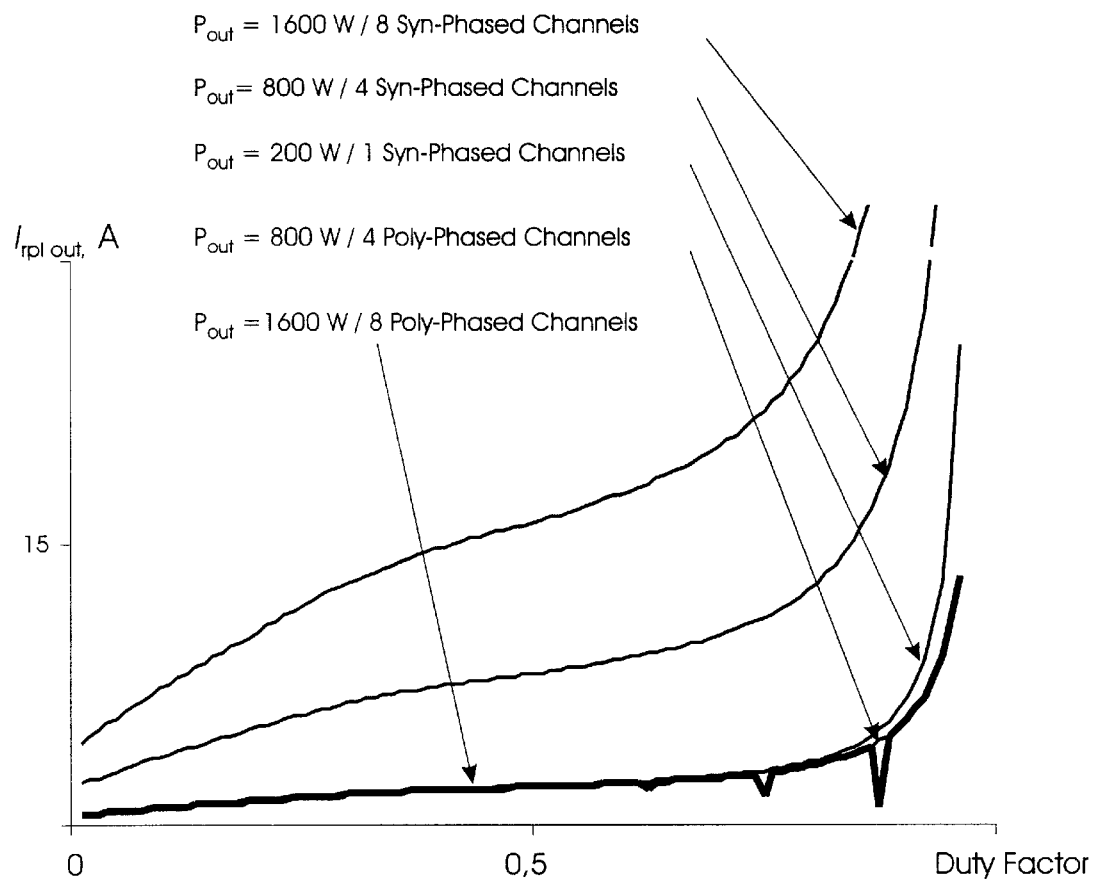
Figure 7:
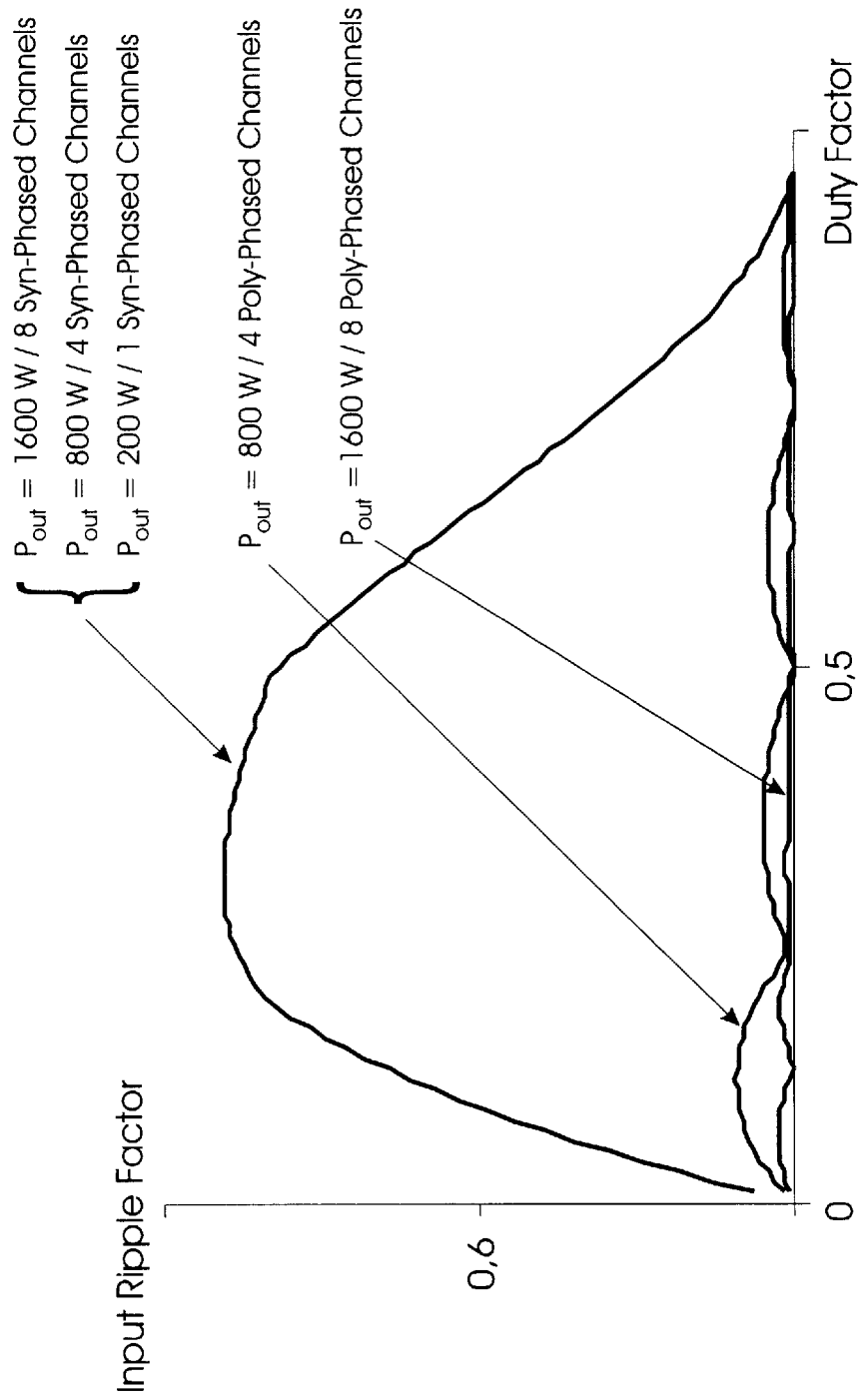
Figure 7:
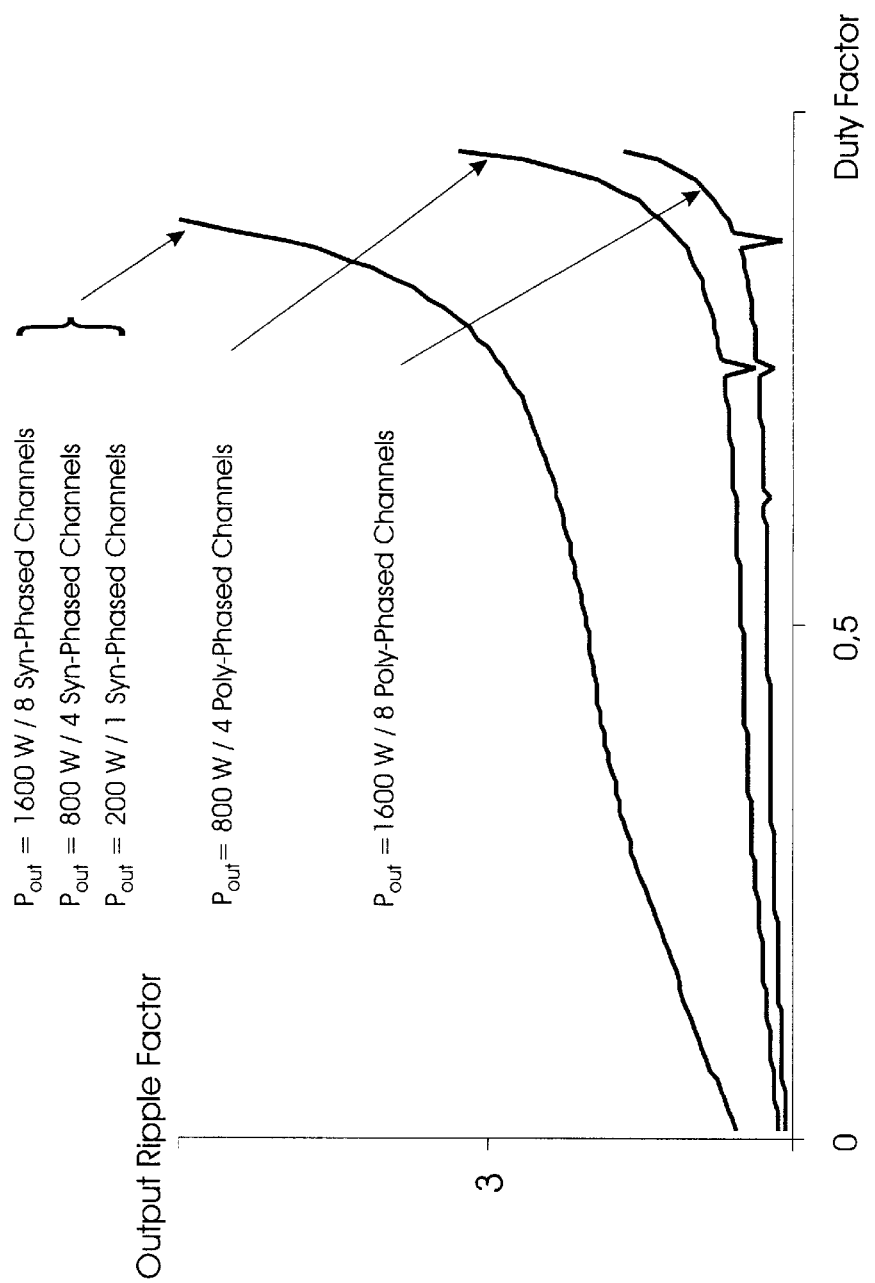
Figure 8:
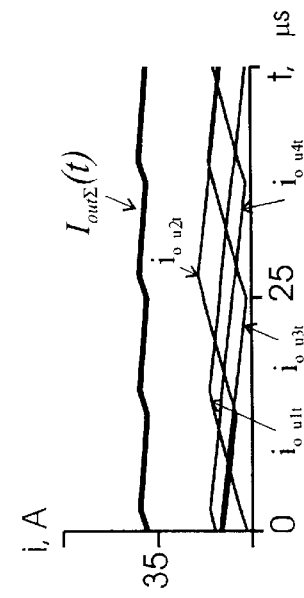
Figure 8:
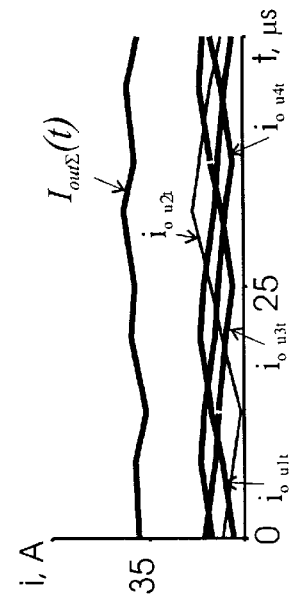
Figure 8:
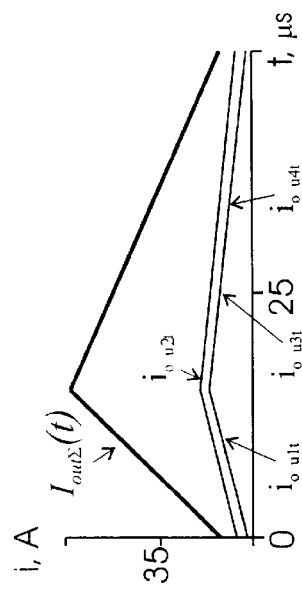
Figure 8:
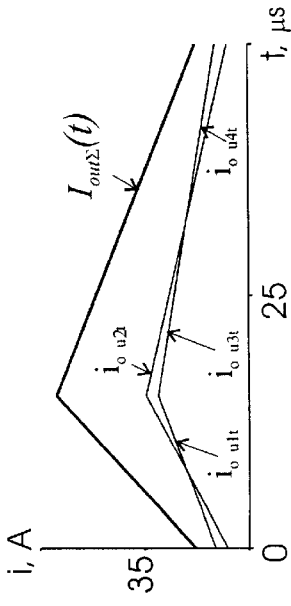
Figure 8I:
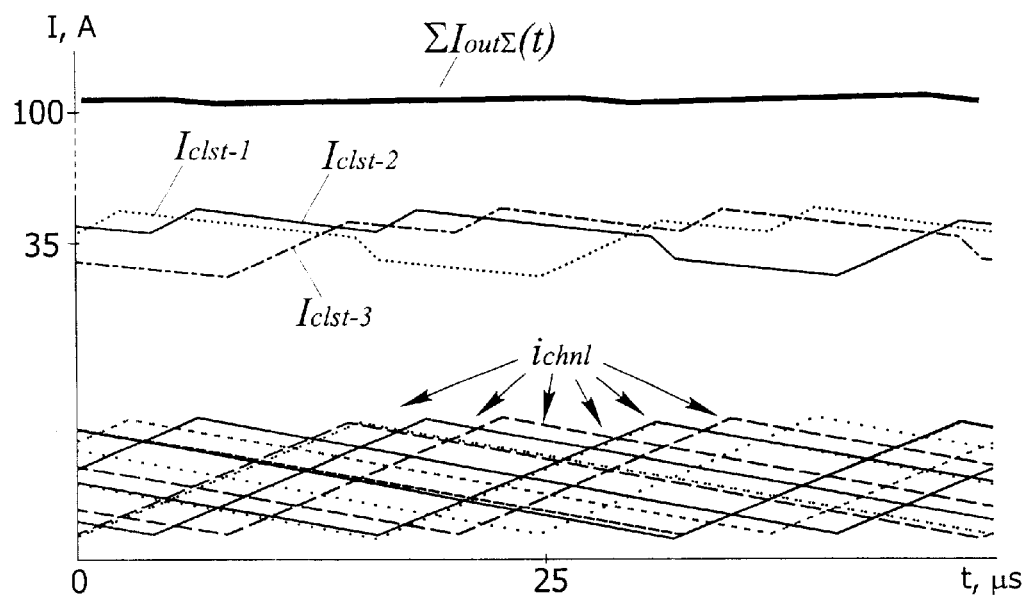
Figure 8J:
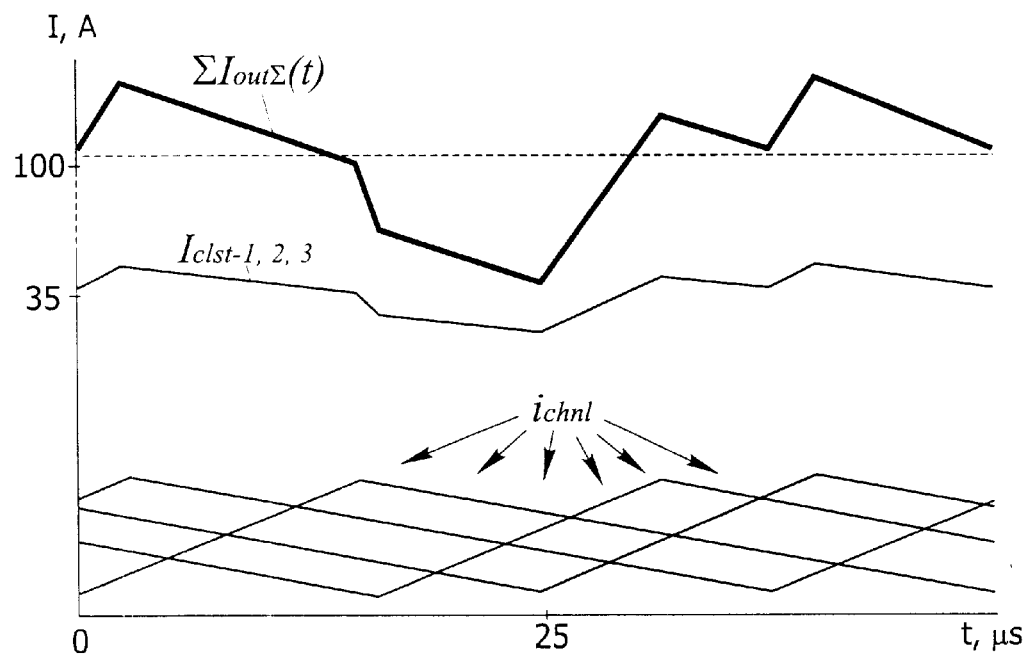
Figure 9:
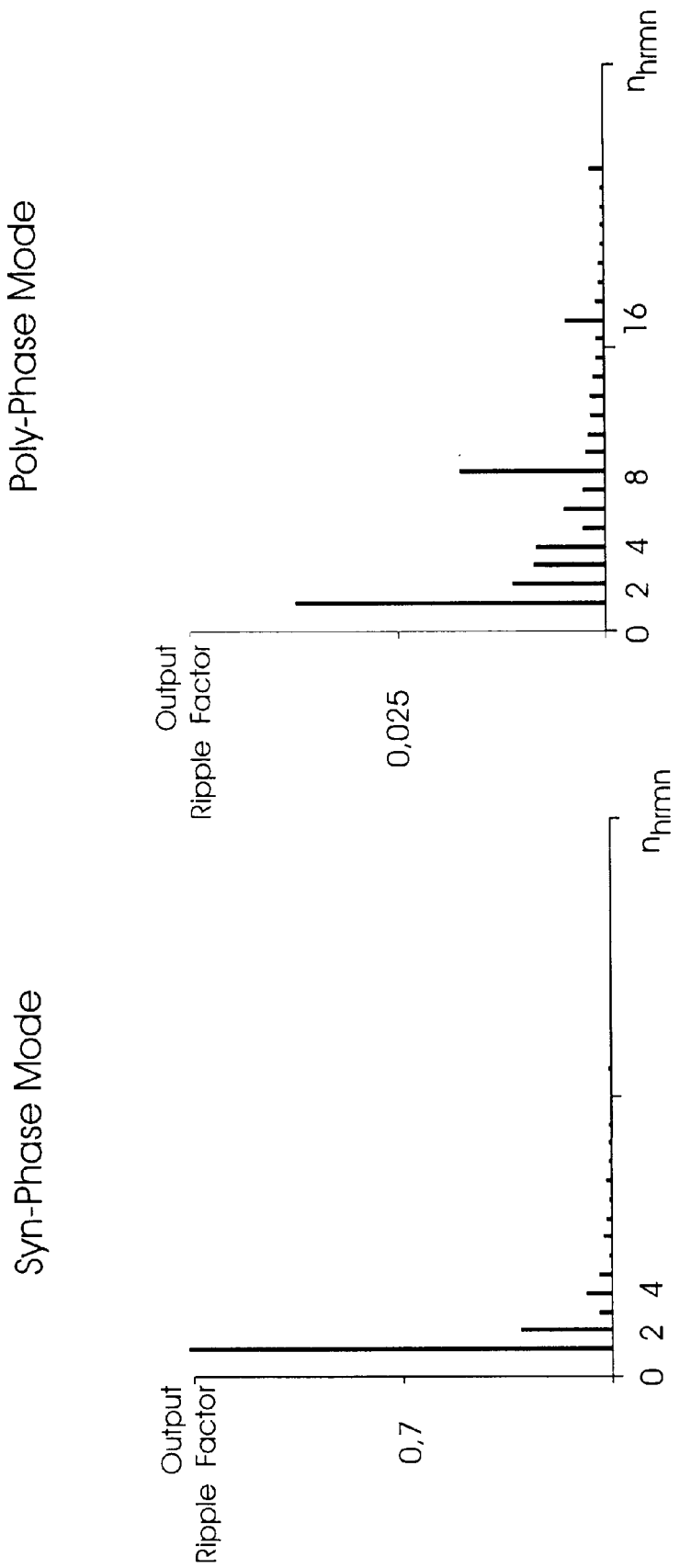
Figure 9:
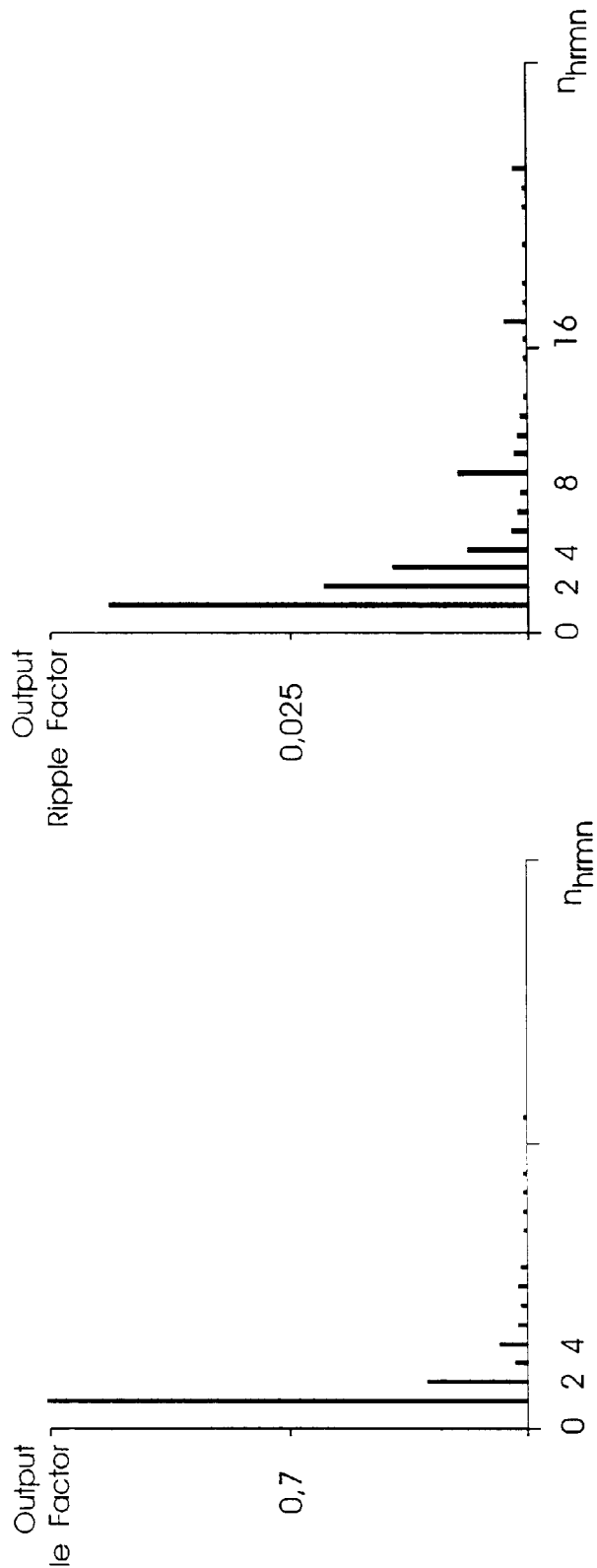
Figure 10:
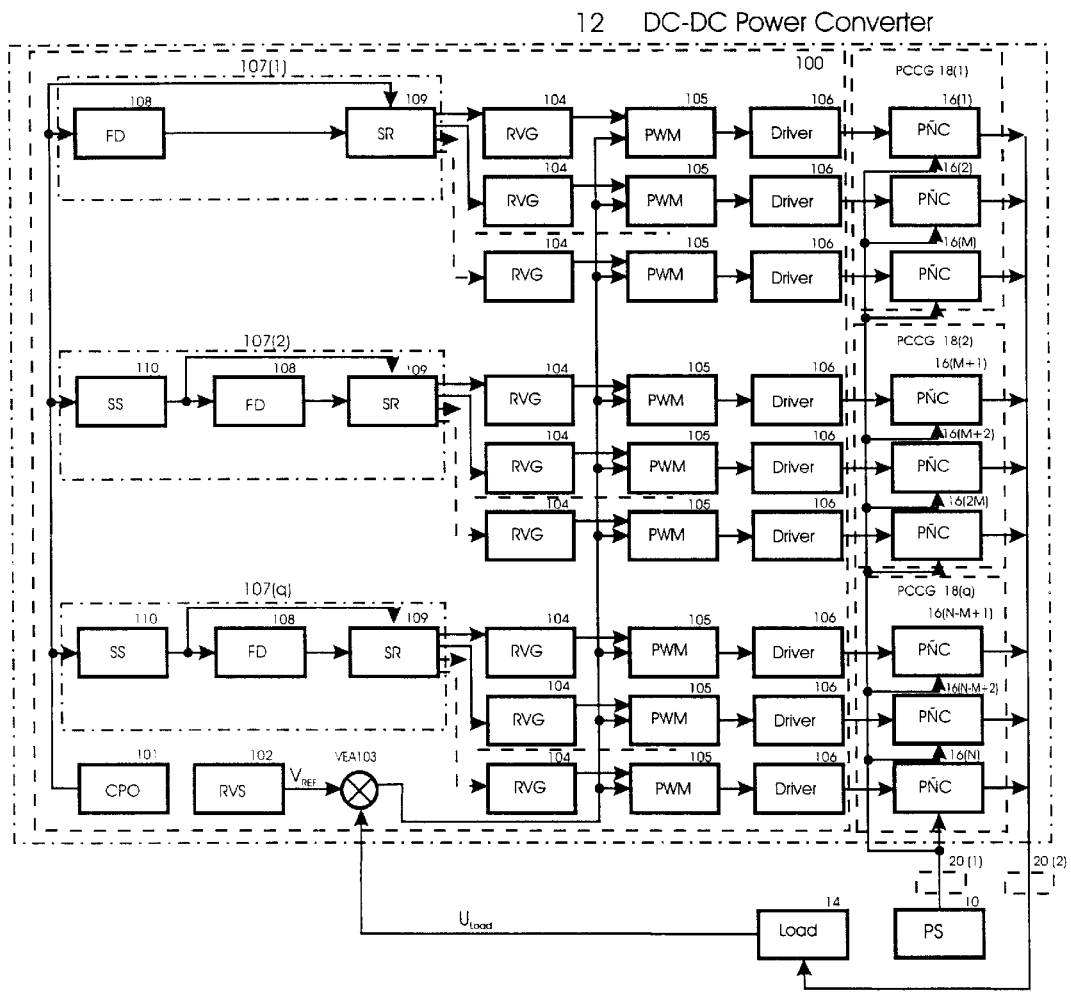
Figure 11:
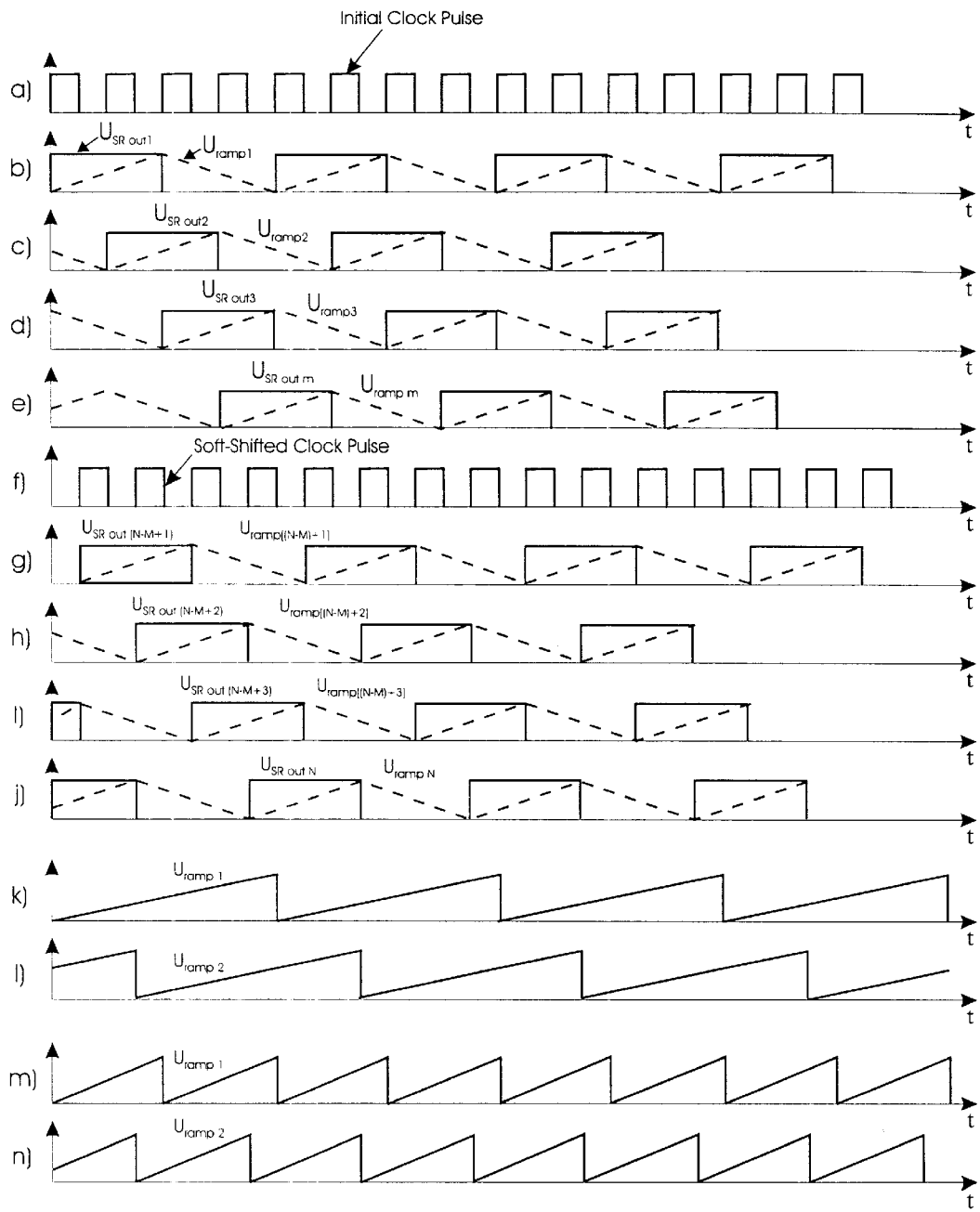
Figure 12:
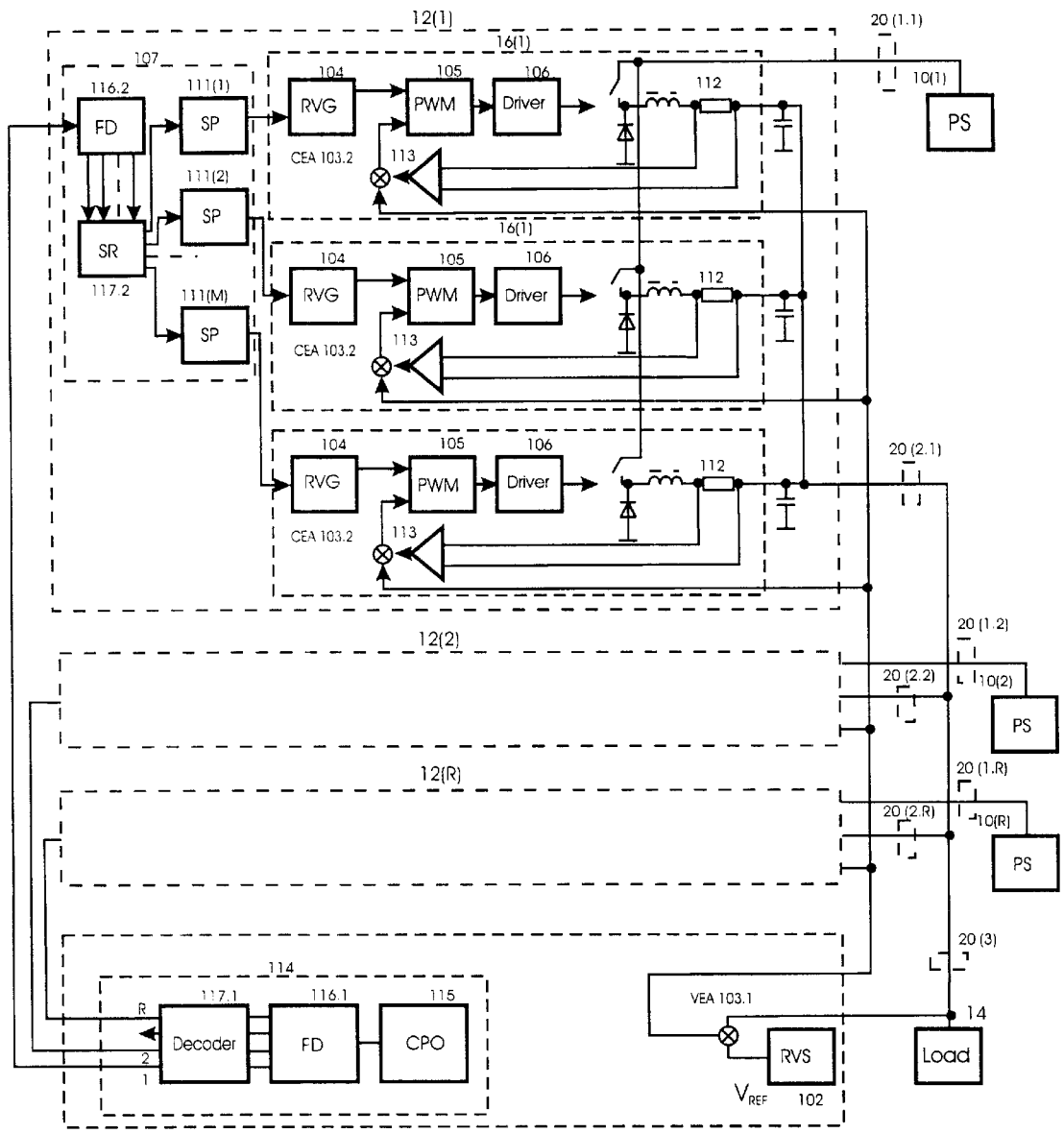
Figure 13:
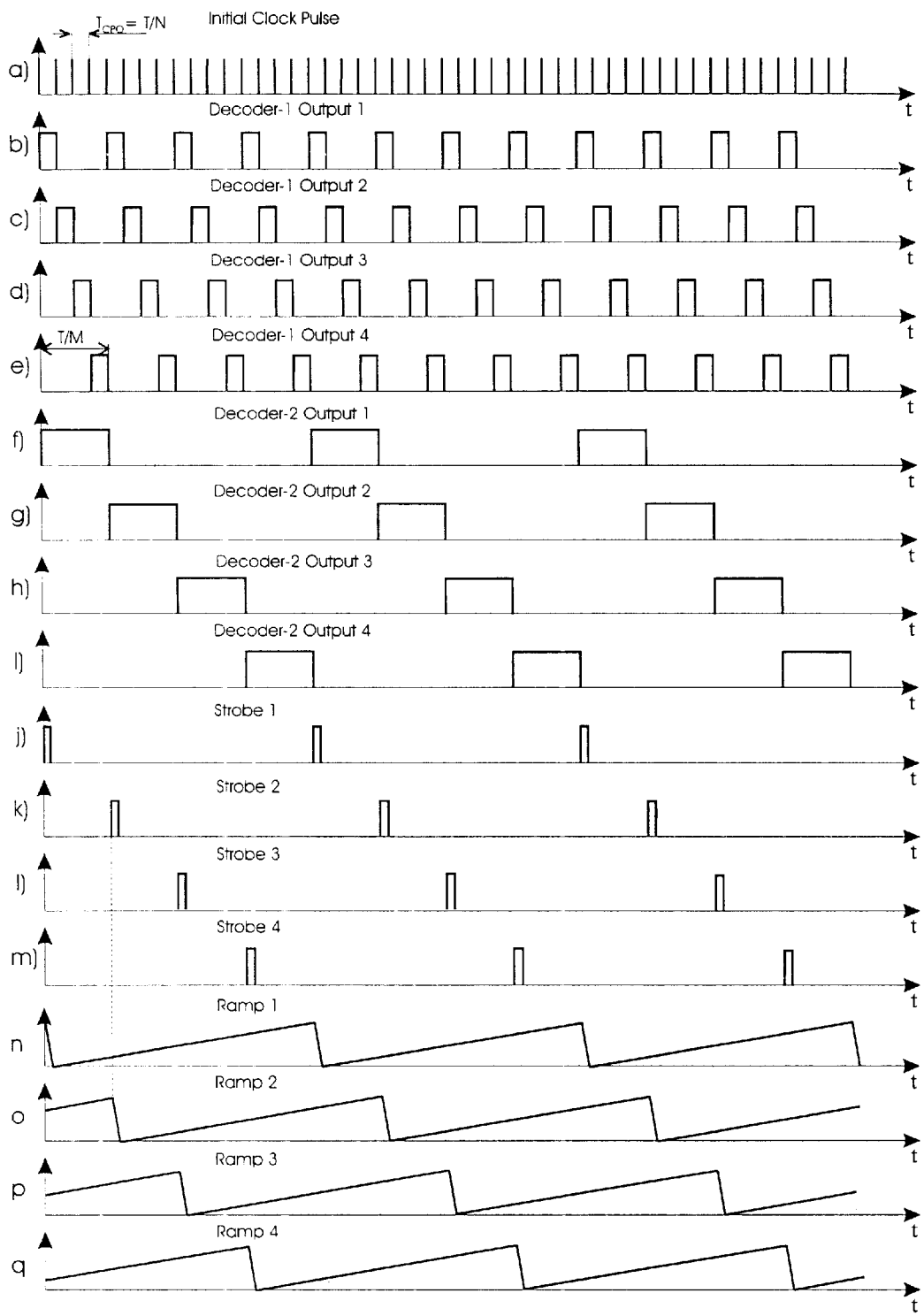
Figure 14:
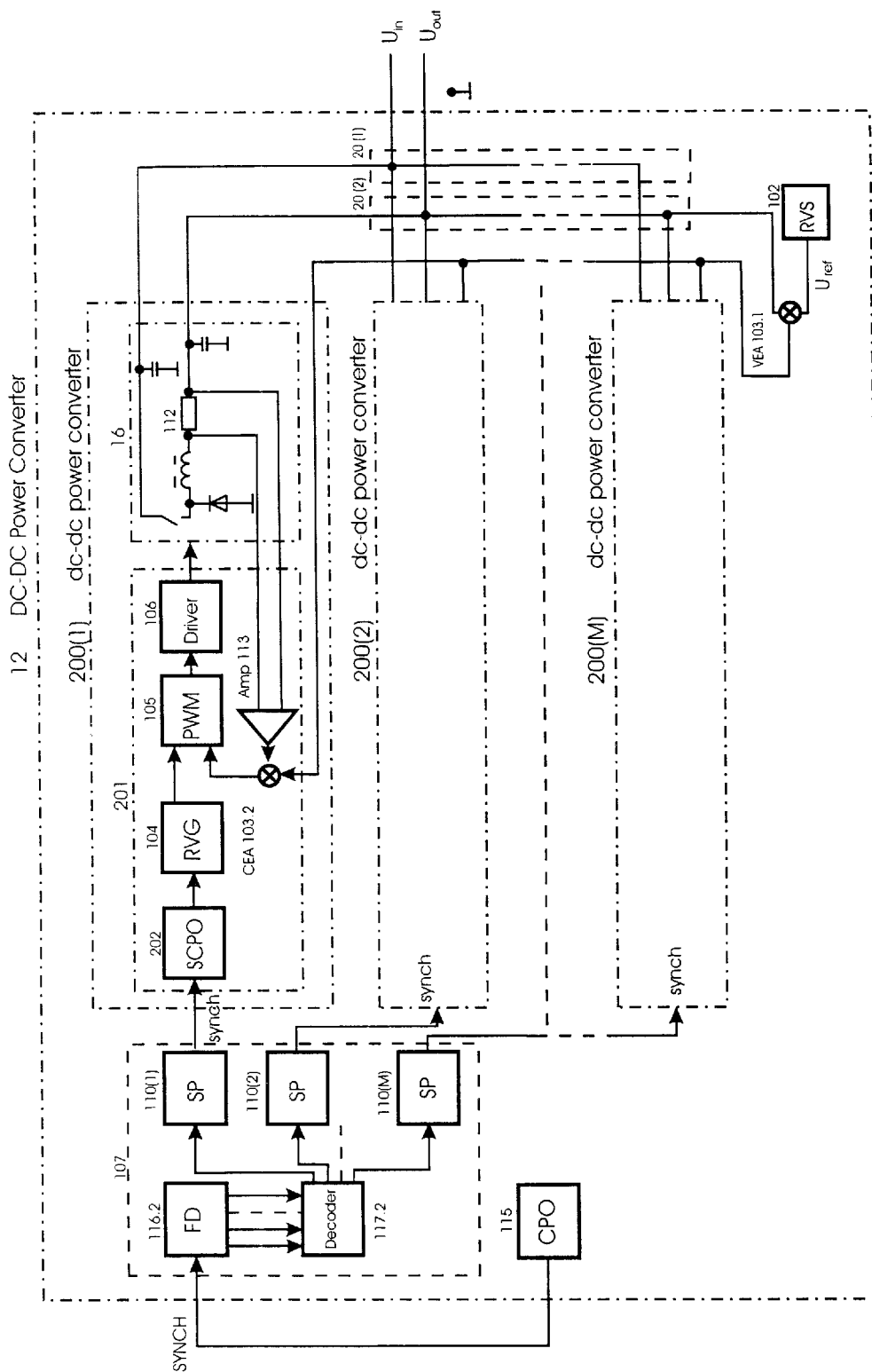

FIG. 6(a)–(c) illustrates a principle of DC-DC power conversion through modular free-running full-wave power conversion channels:

a schematic diagram (a), the timing diagrams for syn-phase (b) and poly-phase (c) modes of conversion;

FIG. 7(a)–(d) illustrates the comparative appraisal of ripple current parameters attributed to syn-phase and poly-phase modes of power conversion;

FIG. 8(a)–(j) illustrates the comparative appraisal of output current wave forms attributed to syn-phase (a,c,e,g), conventional poly-phase (b,d,f,h,j) and clusterized poly-phase (i) modes of power conversion;

Figures 9E, 9F:
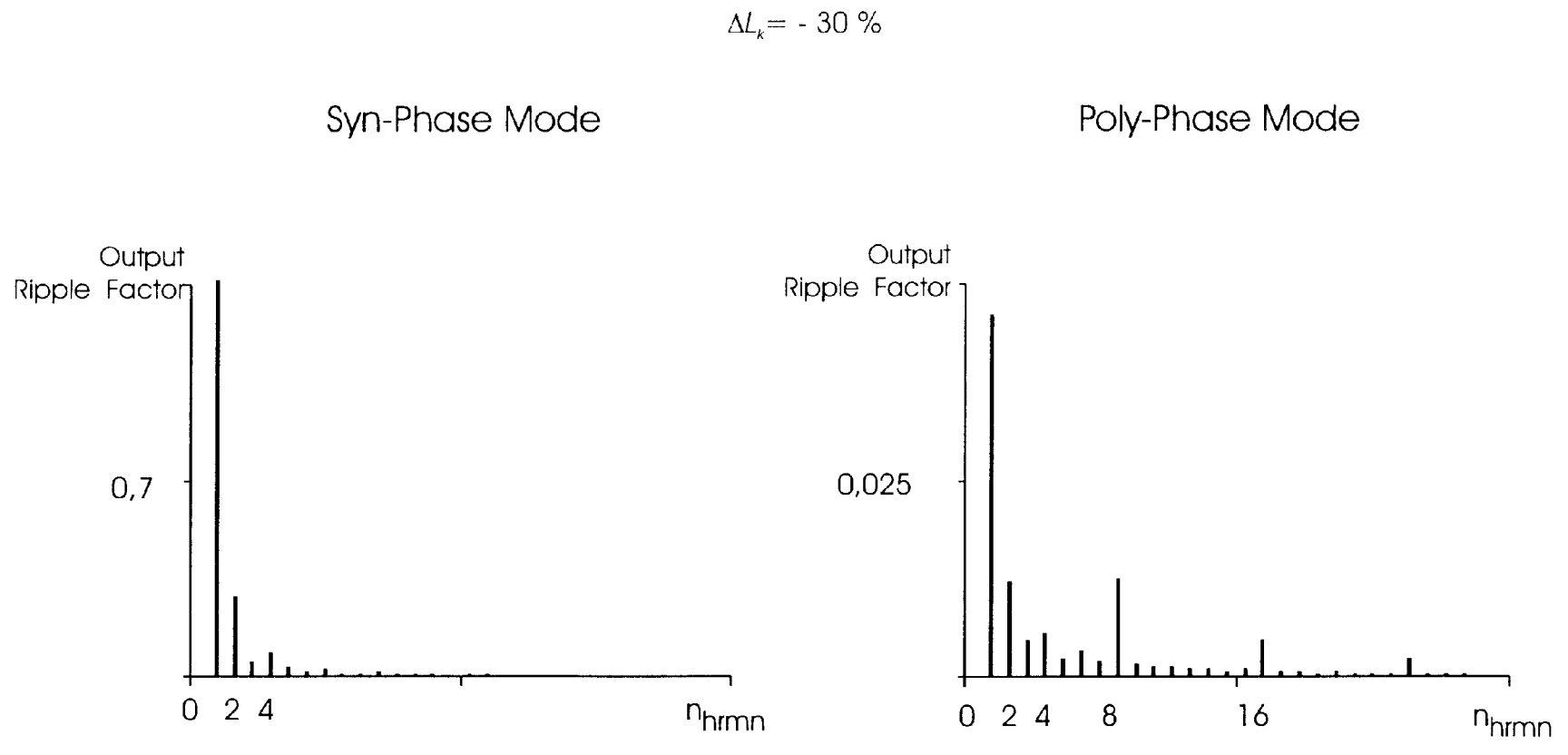

FIG. 9(a)–(j) illustrates the comparative appraisal of factorized ripple spectrum attributed to syn-phase and poly-phase modes of power conversion;

FIG. 10 illustrates a block diagram of power supply system configuration for poly-phase mode of converting the power of one primary source;

FIG. 11 illustrates the timing diagrams according to FIG. 10;

FIG. 12 illustrates a block diagram of power supply system configuration for poly-phase mode of converting the power of multiple primary power sources;

FIG. 13 illustrates the timing diagrams according to FIG. 12;

FIG. 14 illustrates a block diagram of modular DC-DC power converter comprising a multiplicity of similar unitary dc-dc power converters of a pulse-width-modulation type.

Figure 15:
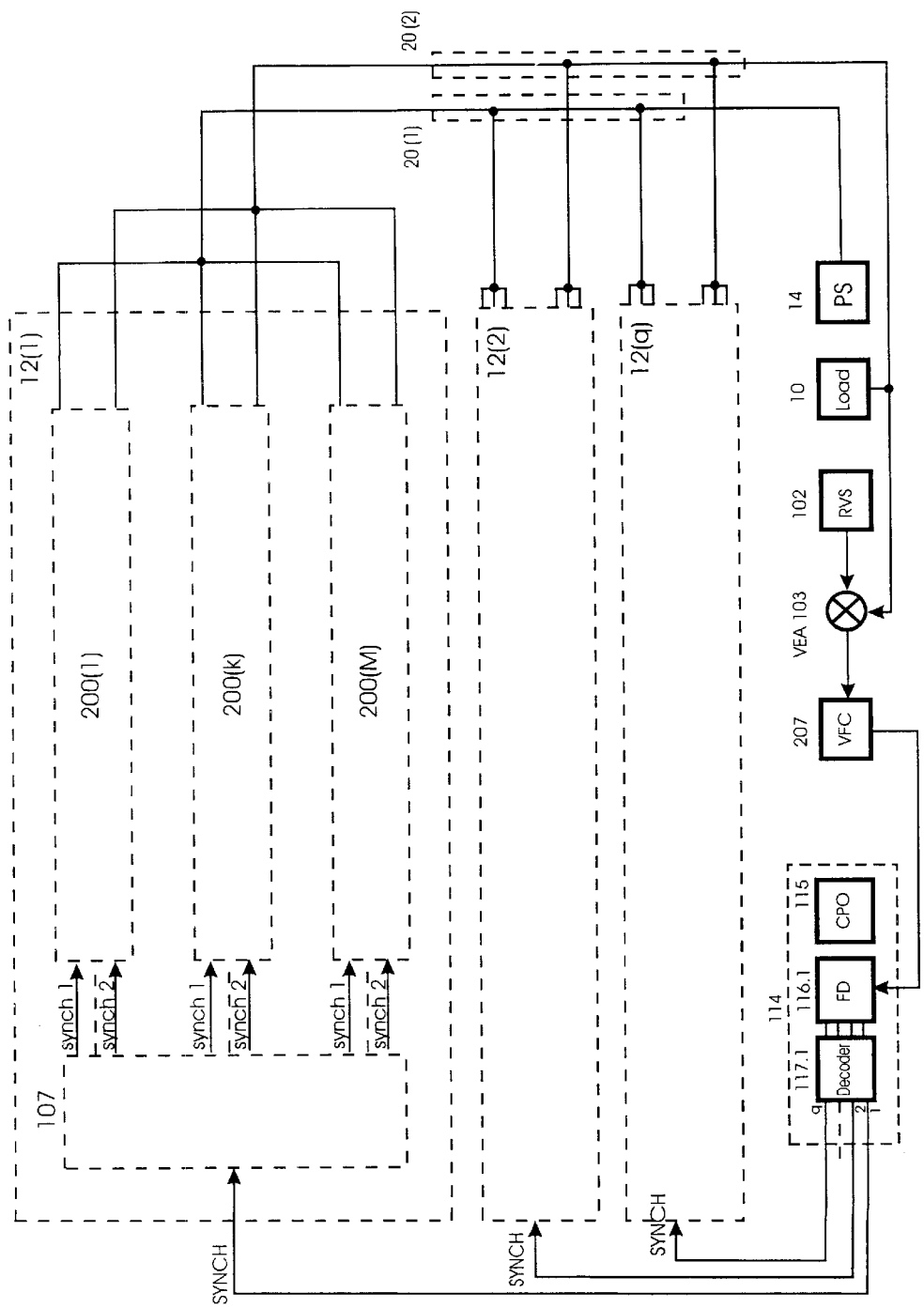

FIG.15 illustrates a block diagram of modular DC-DC power conversion system configuration comprising a multiplicity of similar multi-channel DC-DC power converters.

DETAILED DESCRIPTION OF THE PREFERRED EMBODIMENTS

Block diagrams of the most common power sharing DC-DC conversion system configurations are shown in FIG. 1(a,b,c).

As used herein, the term 'poly-phase' shall have its regular meaning, including but not limited to 'multi-phase', etc.

Figure 1A:
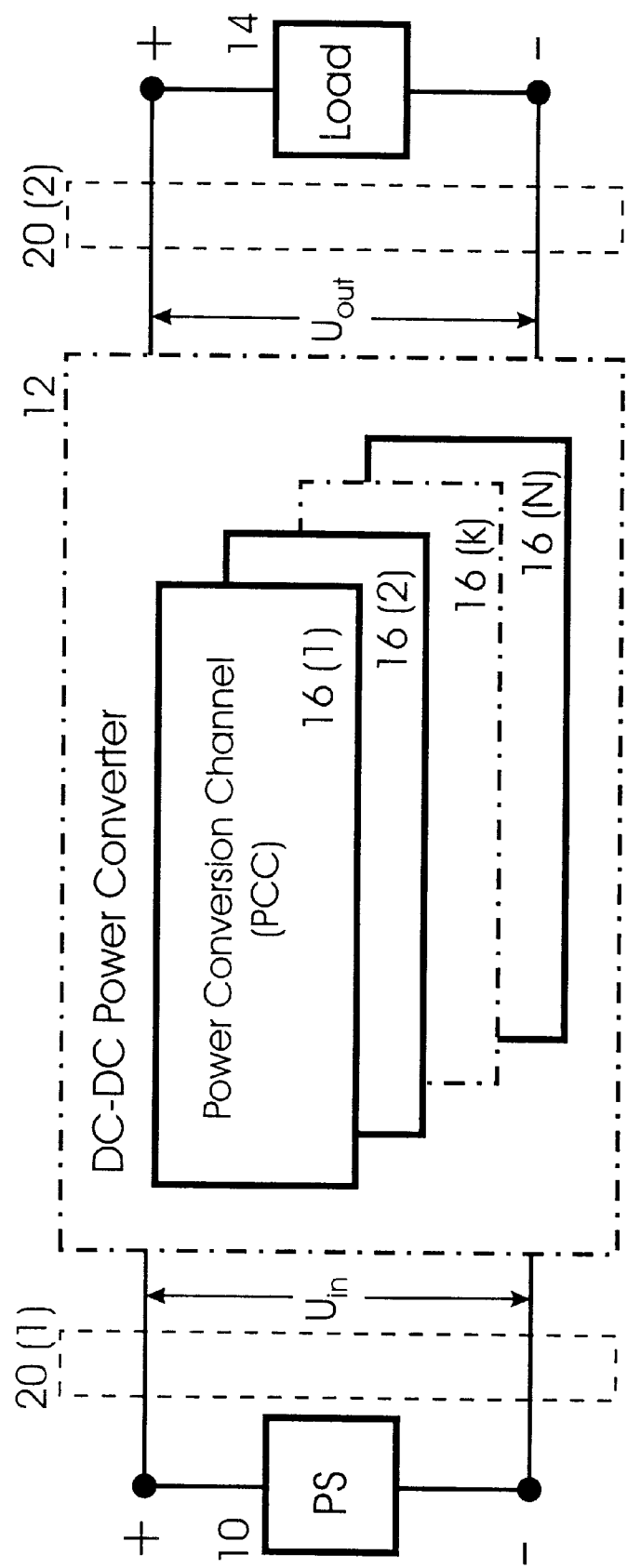
FIG. 1(a)–(c) illustrates the schematic diagrams of power supply system configurations.

The system shown at FIG. 1(a) includes a DC power primary source 10, a multi-channel DC-DC power converter 12 and a load 14. In general, the multi-channel DC-DC converters 12 may be of any existing topology, provided that every multi-channel DC-DC converter 12 contains multiple internal switch-mode DC-DC power conversion channels 16(1), 16(2), 16(k), 16(N). Each channel 16 delivers a portion of power from the primary source 10 to a load 14, provided that all channels 16 have common a operating frequency for the power-on cycles of power conversion.

The items 20 shown as dashed lines are electric summing circuits through which all other main items of the power conversion system are essentially coupled in common. In it's simplest form, the summing circuit 20 is a set of ordinary electrical contacts, or summing may be performed by more sophisticated circuitry. The purpose of the summing circuits 20 is to provide electrical couplings and compatibility between the sub-systems to be coupled as well as to sum the portions of power processed in a power sharing mode of DC-DC conversion.

Figure 1B:
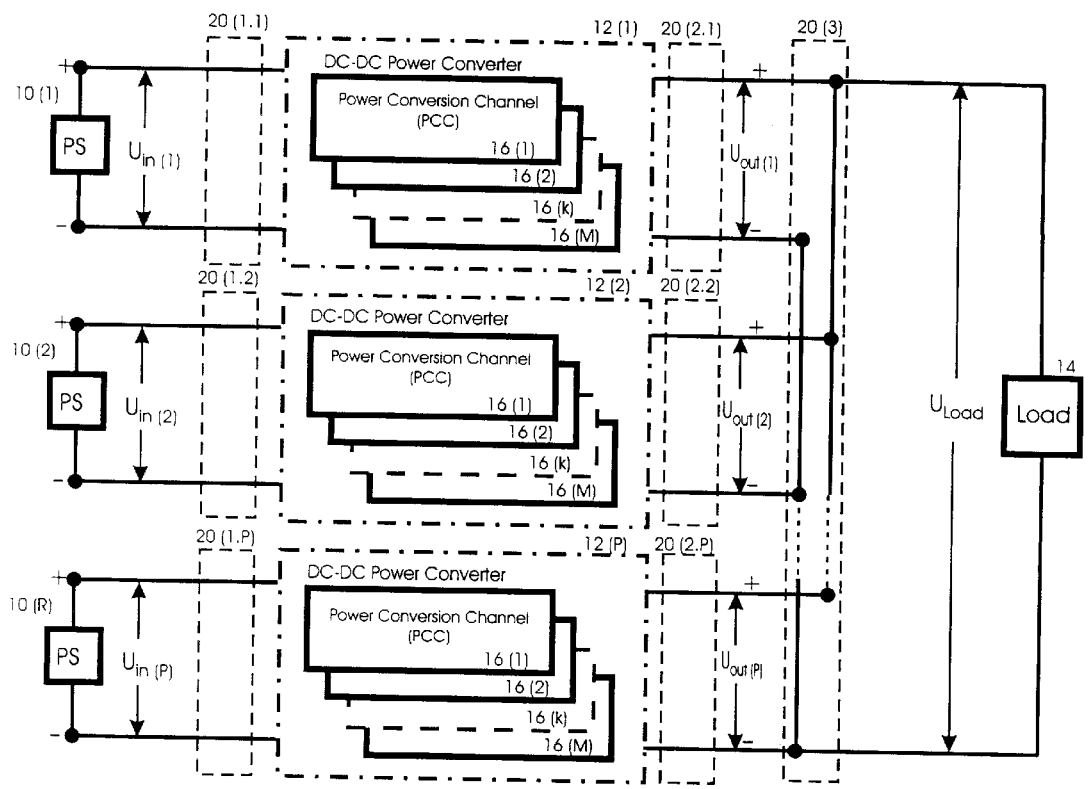

The system shown at FIG. 1(b) includes multiple DC power primary sources 10(1), 10(2), ..., 10(P), multiple DC-DC power converters 12(1), 12(2), ..., 12(R), and one common load 14. The summing circuits 20 (1.1), 20(1.2), ..., 20(1.P) each provide compatible couplings between the corresponding primary power sources 10) and power converters 12 as well as sum the portions of power consumed from each primary power source 10. The summing circuits 20(2.1), 20(2.2), ..., 20(2.P) provide couplings between the corresponding converters 12 and a load summing circuit 20(3) as well as sum the portions of power processed within each of the internal power conversion channels 16(1), 16(2), 16(k), 16(M). The summing circuit 20.3 provides couplings between everyone of summing circuits (20(2.1)), (20(2.2)), ..., 20(2.P) and a load 14 as well as sums the portions of power delivered through each of the power converters 12(1), 12(2), ... ,12(P).

Figure 1C:
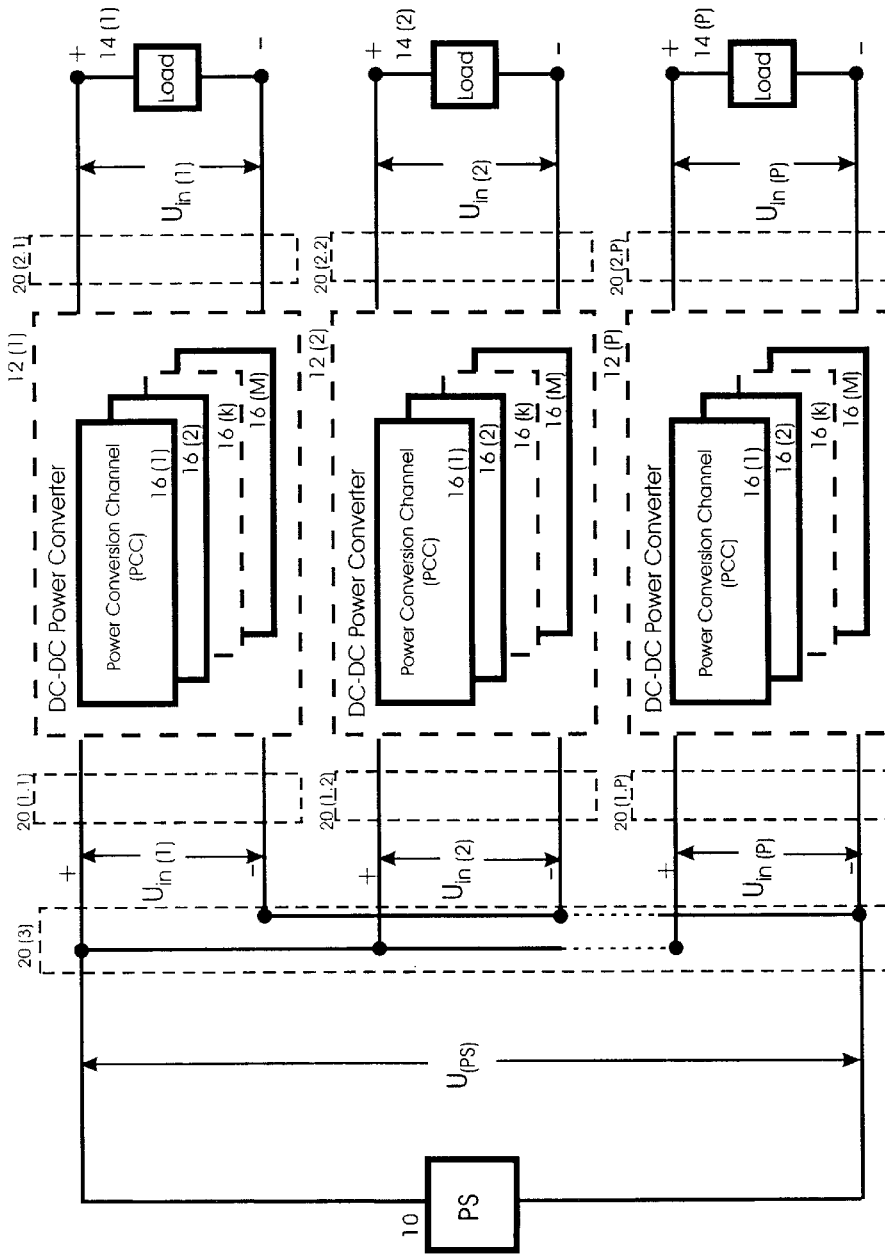

The system shown at FIG. 1(c) includes one common primary power source 10, multiple DC-DC power converters 12(1), 12(2), ..., 12(P) and multiple loads 14(1), 14(2), ... 14(P). A summing circuit 20.3 provides couplings between the primary power source 10 and everyone of totalizers 20(1.1), 20(1.2), ..., 20(1.P) as well as sums the portions of power consumed from the primary power source by every power converter 12(1), 12(2), ..., 12(P). The summing circuits 20(1.1), 20(1.2), ..., 20(1.P) provide compatible couplings between the summing circuit 20(3) and the power converters 12(1), 12(2), ..., 12(P) as well as sum the portions of power consumed by each of the internal unitary power conversion channels 16(1), 16(2), 16(k), 16(M). The summing circuits 20(2.1), 20(2.2), ... 20(2.P) provide compatible couplings between the corresponding converters (12) and loads 14 as well as sum the portions of power delivered through each of internal power conversion channels 16(1), 16(2), 16(k), 16(M).

Figure 2:
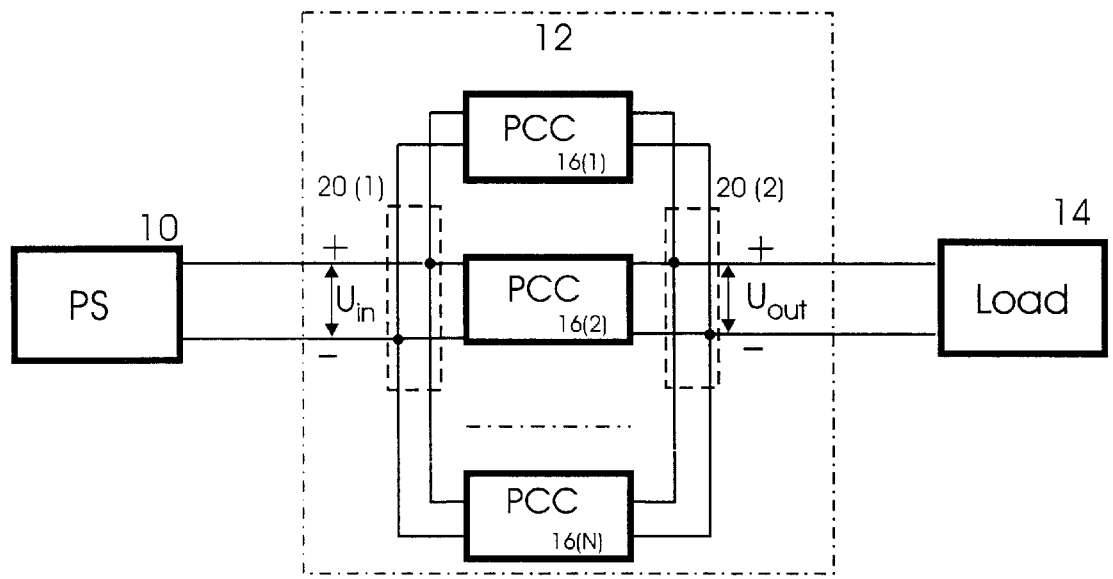
FIG. 2(a)–(d) illustrates the schematic diagrams of coupling configurations for input and output circuits of DC-DC power conversion modular channels.
Figure 2:
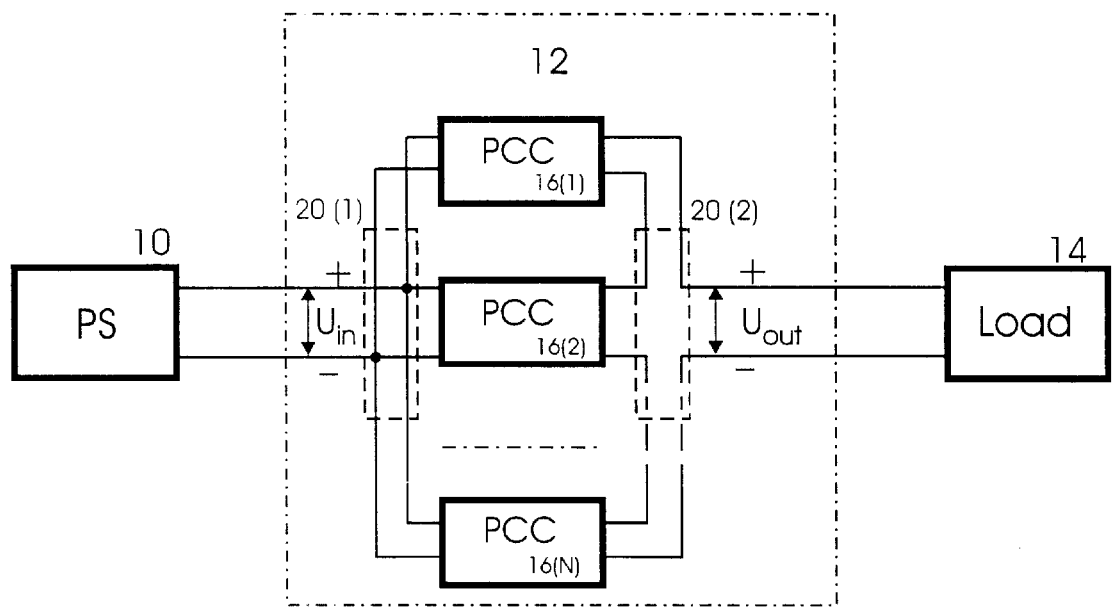
Figure 2:
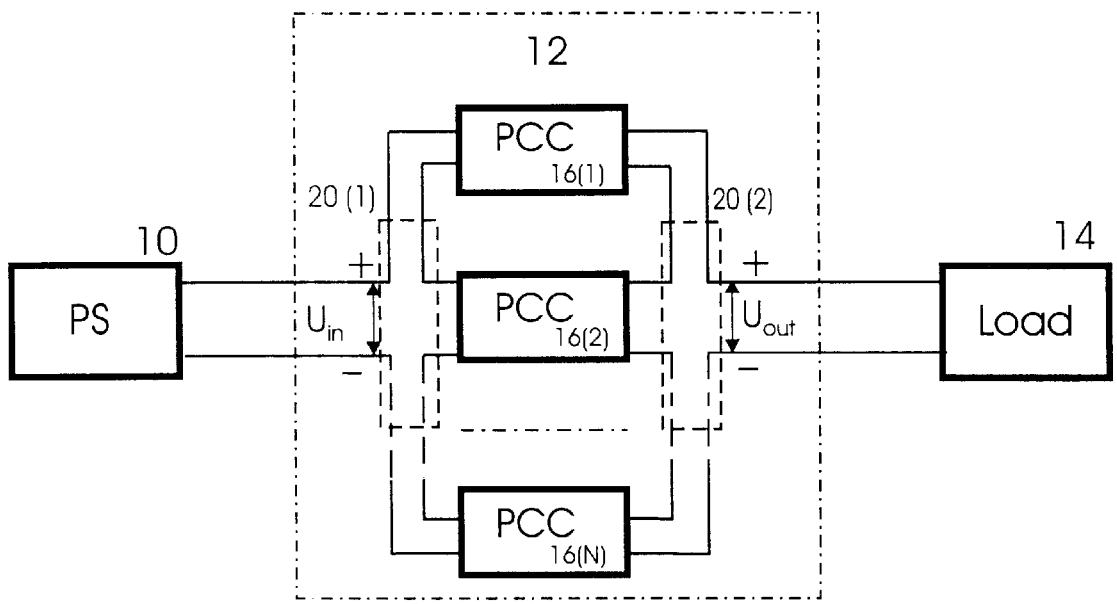
Figure 2:
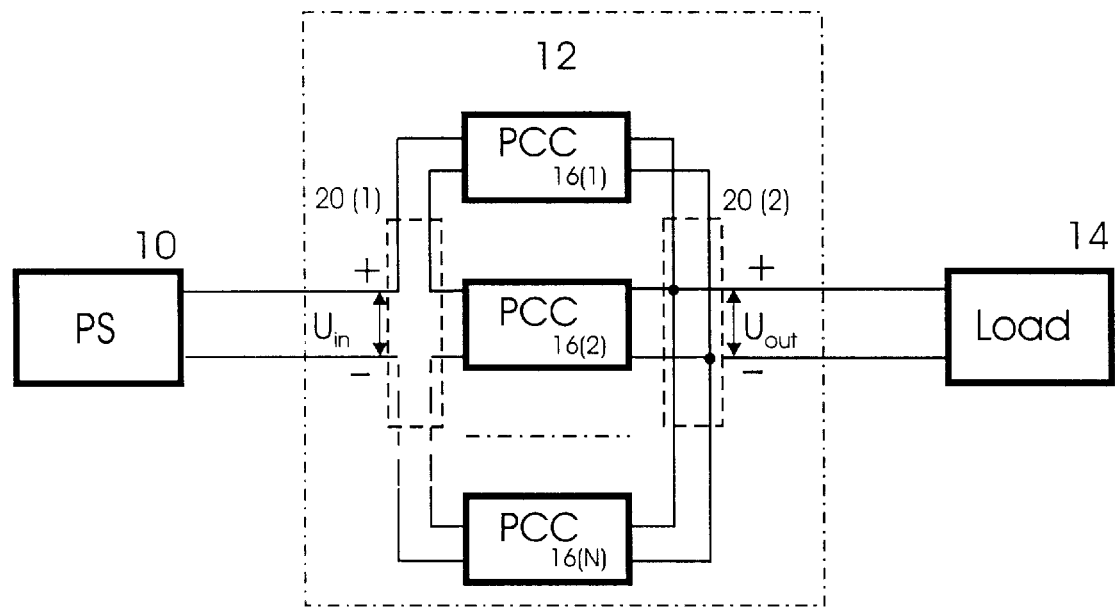

The internal configuration of power converters 12, i.e. the architecture of combining the internal power conversion channels 16 is typical one of four designs, as shown at FIG. 2(a,b,c,d).

FIG. 2(a) is a block diagram of parallel-to-parallel configuration of power conversion channels 16. The configuration delivers higher DC output current at the same DC output voltage than can be delivered by a single power conversion channel 16.

FIG. 2(b) is a block diagram of parallel-to-series configuration of power conversion channels 16. The configuration delivers higher DC output voltages than can be delivered by a single channel 16.

FIG. 2(c) is a block diagram of series-to-series configuration power conversion channels 16. The configuration handles higher DC input voltages than can be handled by a single power conversion channel and delivers higher DC output voltages than can be delivered through a single power conversion channel 16.

FIG. 2(d) is a block diagram of series-to-parallel configuration of power conversion channels 16 The configuration handles higher DC input voltages than can be handled by a single power conversion channel and delivers higher DC output power than can be delivered by a single power conversion channel 16.

Within every configuration the input summing circuits 20(1) while summing the portions of power consumed from the primary sources 10, provide compatible couplings between the primary sources 10 and internal power conversion channels 16 as well as between the inputs of channels 16. Therefore the output summing circuits 20(2) while summing the portions of power delivered to the load 14 provide compatible couplings between the channels 16 and the load 14 as well as between the outputs of channels 16. The summing function of summing circuits 20 is an indispensable feature of the present invention thus being further described.

Figure 3:
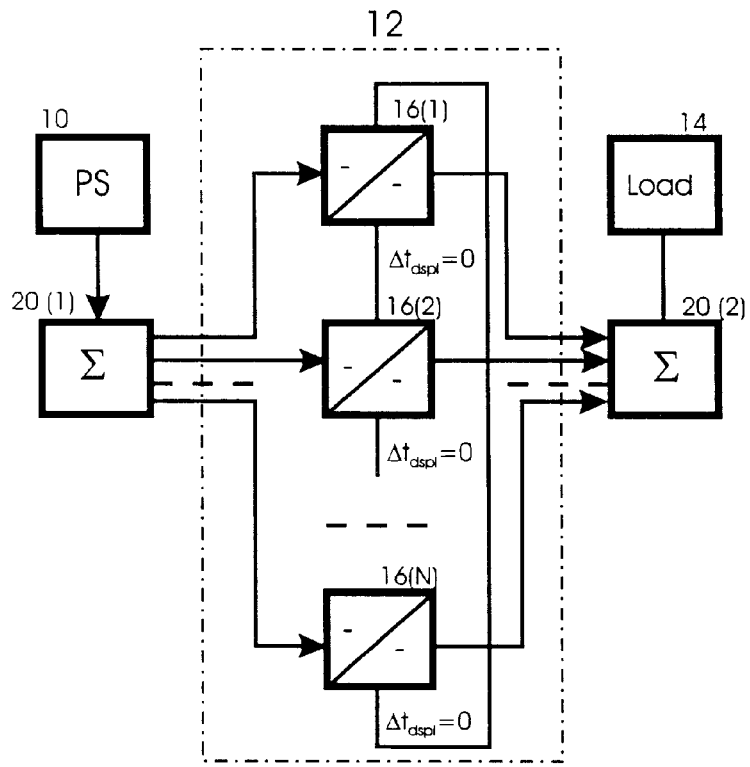
FIG. 3(a)&(b) illustrates the schematic diagrams of DC-DC converters with syn-phase (a) and poly-phase (b) modes of conversion.
Figure 3:
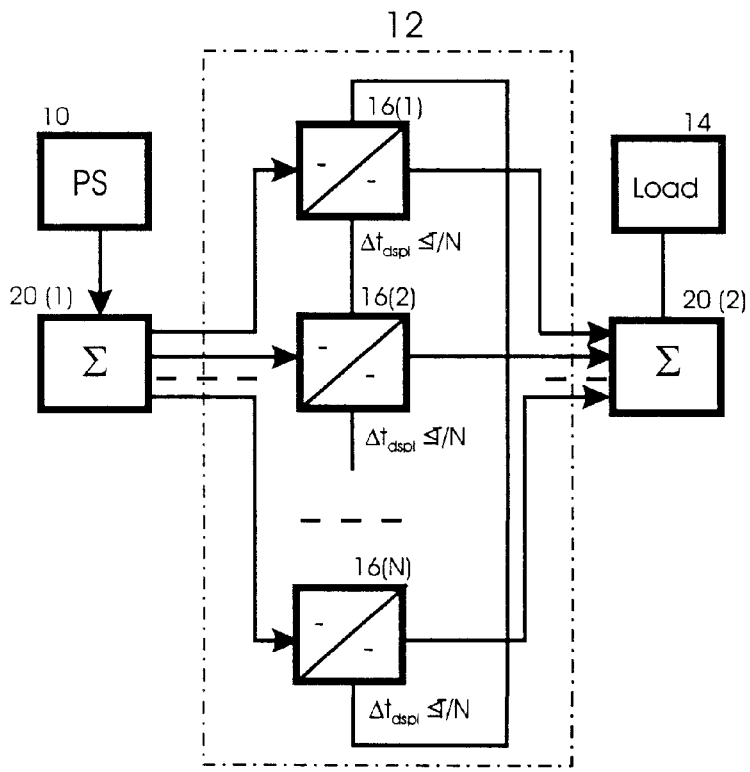
Figure 4:
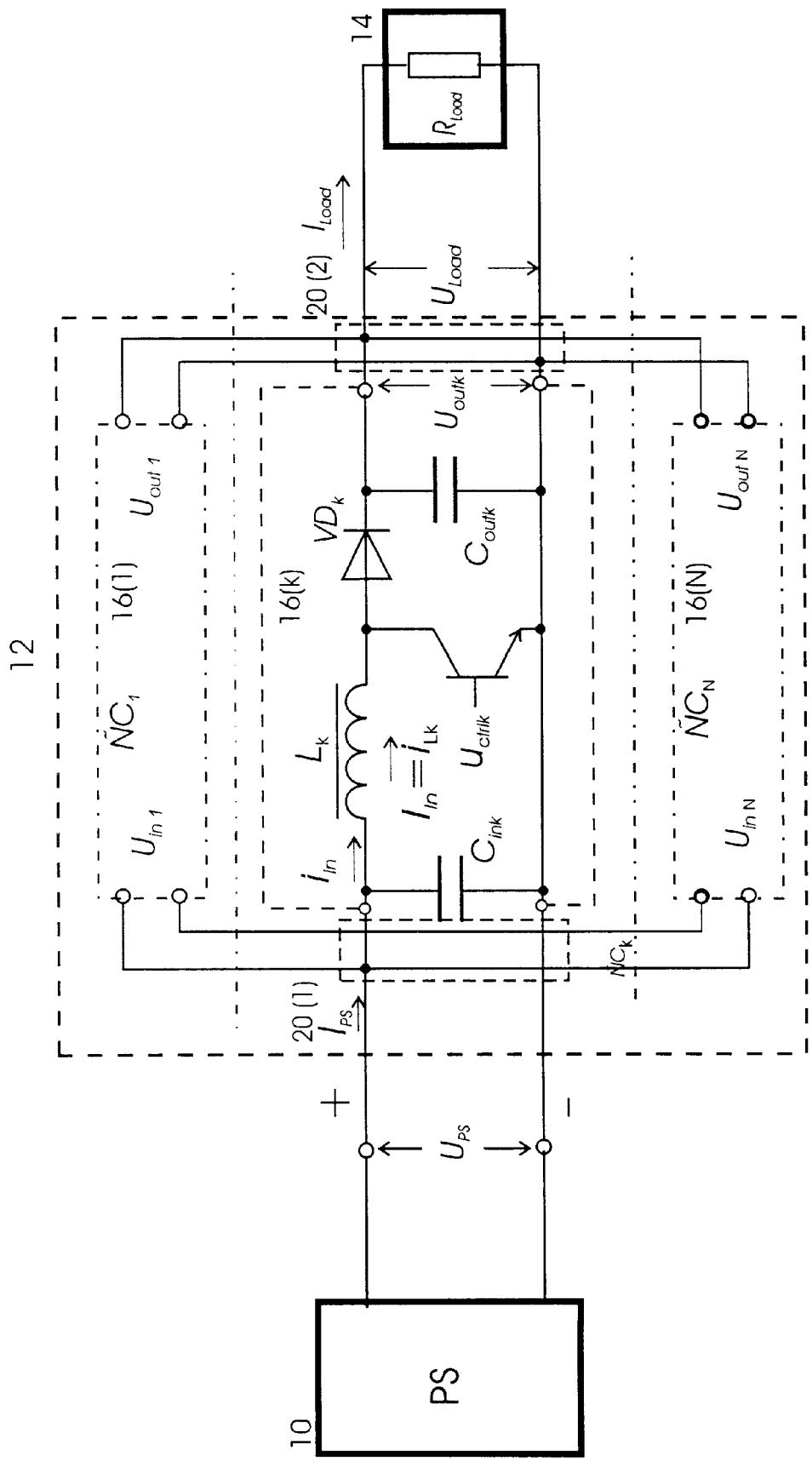
FIG. 4(a)–(e) illustrates a principle of DC s power conversion through modular boost power conversion channels with pulse width modulation control.

FIG. 3(a,b) is a block diagram of a multi-channel DC-DC power conversion configuration design.

In relation to overall power draw consumed from the DC power primary source 10 the summing function of summing circuit 20(1) should be described as gathering into a power segment the individual portions of power consumed by every internal power conversion channel 16 across on-going power-on cycle.

In relation to overall power draw delivered to a load 14 the summing function of summing circuit 20(2) should be described as gathering into a power segment the individual portions of power processed by every internal power conversion channel 16.

Therefore the quality of power draw consumed from the primary source and the quality of power draw delivered to the load completely depends on the quality of bunching the corresponding portions of power.

As shown in FIG. 3(a,b), there are two typical modes of operation for synchronizing the switch mode cycles within individual power conversion channels.

In a syn-phase mode of power conversion, as shown at FIG. 3(a), all power converters 16 operate with their power-on cycle's starting-on simultaneously. The simultaneous switch-on cycles create large instantaneous power draws and large drops in voltage of the primary power source 10, as well as a substantial ripple in current delivered to the load 14. These impairments are caused by the simultaneous superimposing of similar non-linear responses within the summing circuits 20 caused by the non-linearity of any power conversion process.

In a poly-phase mode of power conversion, as shown at FIG. 3(b), all channels 16 operate with their power-on cycles starting-on in a time-staggered relationship so, that there is an $\Delta t_{dspl}$ interval between the start-on points of the sequential cycles. In this mode both the resultant power demand from the primary source 10, and the resultant delivery power draw are time-staggered delivering substantial improvement in limiting non-linear constituents.

Though following the prior art it is evident that the resultant power segments produced within the summing circuits 20(1) and 20(2) using the poly-phase mode of conversion are of much better quality when compaired to syn-phase mode power conversion. It is also evident that even with the better quality of poly-phase mode operation, both methods still exhibit non-linear properties, i.e. still contain a high level of ripple constituents caused by imperfect inter-compensation of superimposed non-linearity while individual portions of power being overlapped within summing circuits 20.

The benefit of the present invention is that, for optimal inter-compensation of non-linearity of individual portions of power processed within internal unitary power conversion channels 16, the time-staggering, i.e. value for $\Delta t_{dspl}$ interval between the start-on points of the sequential cycles, should be adjusted within a wide range of:

$$0 < \Delta t_{dspl} \leq T/N,$$

where T is the period of common operating frequency and N is the number of internal power conversion channels (16).

The further benefit and the core of the present invention is that these resultant power segments should be regarded as individual portions of power to be further summed within the next level summing circuits, also in a time-staggered manner, i.e. in a poly-phase mode, for further optimal inter-compensation of non-linear constituents.

For this purpose the poly-phased power-on cycles of any group clustered power conversion channels are regarded as switch-on clusters to be further time staggered for optimal inter-compensation of non-linearity persistent in the power clusters to be summed in the second stage. For poly-phasing the switch-on clusters the same considerations about setting up a $\Delta t_{dspl}$ interval between the start-on points of sequential clusters are valid as for poly-phasing the individual switch-on cycles except that a number of clusters instead of a number of internal unitary power conversion channels 16 should be taken into account.

FIG. 10 illustrates a block diagram of power supply system configuration for performing the method for clusterized power sharing conversion and FIG. 11 illustrates the timing diagrams of its operation.

The system includes one primary power source 10, a modular multi-channel DC-DC converter 12 and a load 14. Multiple N internal power conversion channels 16 are subdivided into Q number of power conversion channel clusters 18. Each cluster 18 includes M number of internal power conversion channels 16. The input summing circuits 20(1) provides electrical couplings between the primary source 10 and the inputs of internal power conversion channels 16 as well as sums the portions of power consumed by internal power conversion channels 16 from the primary source 10. The output summing circuit 20(2) provides electrical couplings between the outputs of internal power conversion channels 16 and a load 14 as well as sums the portions of power converted by the internal power conversion channels 16.

A control circuit 100 includes a clock pulse oscillator 101 a reference voltage source 102, a comparator 103, N number of ramp voltage generators 104, N number of pulse width modulators 105, N number of drivers 106, Q number of synchronization circuits 107. Each synchronization circuit 107 includes a frequency divider/counter 108 and M-bit shift register 109 to drive a corresponding group of internal power conversion channels 16. Every synchronization circuit 107 except the first one 107(1) includes a soft shift circuit 110.

If the power conversion operating frequency is common for all internal power conversion channels, the clock pulse oscillator 101 provides a sequence of initial clock pulses with a period of:

$$T_{CPO}=T/M$$

where T is the period of power conversion operating frequency and M is the count-factor for frequency divider/counters 108 and M-bit shift registers 109.

Shown at FIG. 11(a) the initial clock pulses are applied to synchronization circuits 107. Within the synchronization circuit 107(1) the initial clock pulses are fed to the counter input of the frequency divider/counter 108 and to the clock input of the M-bit shift register 109. The frequency divider/counter outputs a sequence of pulses with a period of:

$$T=T_{CPO}*M.$$

The Pulses are fed to the data input of the M-bit shift register 109. The outputs of the M-bit shift register 109 therefore exhibit the sequential pulses $U_{SRout}$ all having the period of T with their forward edge sequentially shifted for a time interval $T_{CPO}$ as shown at FIG. 11(b,c,d,e).

Each $U_{SRout}$ pulse activates a corresponding ramp voltage generator 104 to produce a saw-tooth pulse $U_{ramp}$ shown as dashed lines at FIG. 11(b,c,d,e) which further activates the pulse width modulator 105. The wave forms at FIG. 11(k,l) and FIG. 11(m,n) illustrate interrelated time-displacement of the ramp voltage sequential generators 104 output signals applicable for activating the pulse width modulators 105 of some alternative designs. The time-displacement between the start-on points of the $U_{ramp\ 1}$ and $U_{ramp\ 2}$ duty cycles is also equal to T/M. The output signal of every pulse width modulator 105 drives corresponding power conversion channel 16 to start a power-on cycle. Therefore all internal power conversion channels 16 within a group 18 are driven in a sequentially time-staggered manner and their power-on cycles are sequentially time-staggered for a time interval $T_{CPO}$ in respect to each successive power-on cycle thus producing a separate power-on cluster.

The soft shift circuits 110 within successive synchronization circuits 107(2), . . . , 107(q) are designated to delay the initial pulses produced by the clock pulse oscillator 101 for a time interval $\Delta t_N$ within the range of:

$$0<\Delta t_N \leq T/N.$$

The delayed sequence of initial clock pulses fed to the input of the frequency divider/counter 108 within the synchronization circuit 107(q) is shown at FIG. 11(f). The M-bit shift register 109 within this circuit exhibits the sequential $U_{SRout}$ pulses as shown at FIG. 11(g,h,i,j). The interrelated time-displacement interval between their fronts is still the same as for that shown at FIG. 11(b,c,d,e) but shifted in relation to the corresponding fronts shown at FIG. 11(b,c,d,e) for established time interval $\Delta t_N$. The nature of driving the corresponding internal power conversion channels 16 within a group 18(q) is the same as described above for group 18(1). The cluster of power-on cycles performed within the group 18(q) is time staggered in relation to the power-on cluster performed within group 18(1).

The common feed-back loop is provided by the voltage error amplifier 103 which outputs the correction signal to the pulse width modulators thus regulating the amount of power converted by the power conversion channels 16 in case of any change to the established load parameters. The reference voltage generator 102 sets up these parameters.

The power sharing conversion efficiency primarily depends on the extent to which the processed power is shared equally among internal power conversion channels.

FIG. 12 shows a block diagram of the modified version of a poly-phase multi-channel DC-DC power conversion system configuration. The system contains R number of multiple multi-channel DC-DC power converters 12. Each converter 12 includes M number of power conversion channels 16, where M is the same for every converter 12. The system synchronization circuit 114 includes a clock pulse oscillator 115, a frequency divider/counter 116.1 and a decoder 117.1 to provide the initial inter-converter time-displacement of T/M.

FIG. 13(a) illustrates the initial clock pulse sequence produced by the clock pulse oscillator 115.

FIG. 13(b,c,d,e) illustrate the time-displaced output signals of the decoder/counter 117.1. Every decoder/counter 117.1 output is coupled to the synchronization input of the corresponding multi-channel DC-DC power converter 12. Each converter 12 is provided with an internal synchronization circuit 107 including frequency decoder/counter 116.2, shift register 117.2 and multiple strob-mono-pulse oscillators 111. Frequency divider/counter 116.2 provides M number of time-displaced output signals shown at FIG. 13(f,g,h,i) with a time-interval of T/N between the front edges of the M output signals. The shift register 117.2 further distributes these signals to sequentially activate the corresponding strob-mono-pulse oscillators 111 as shown at FIG. 13(j,k,l,m) therefore enabling the ramp voltage generators 104 to activate the pulse width modulators 105, as shown at FIG. 13(n,o,p,q).

To provide symmetry, i.e. equalizing the corresponding electrical parameters within the power conversion channel, output inductor current feed-back loops are connected to the output inductor current sensors 112, boosting amplifier 113 and current error amplifier 103.2. Each local feed-back loop is connected to a common output voltage feed-back loop provided by the reference voltage generator 102 and voltage error amplifier 103.1, therefore equalizing the output currents within the internal power conversion channels 16 provides support for a wide range in load variation.

Since the synchronizing signals derived from outputs of the decoder/counter 117.1 are timely shifted for an interval of T/N=T/MR then corresponding power-on cycles and persistent ripple are also timely shifted for the same interval causing the N=MR times increase of resultant output ripple frequency in comparison with output riple frequency of the single power conversion channel 16, while the prior art poly-phased power sharing techniques provide only N=R times increase of resultant ripple frequency in comparison with the same of the single power conversion channel 16.

FIG. 14 illustrates a multi-channel DC-DC power converter 12 configuration containing M number of conventional off-the-shelf power converters 200 of any traditional topology. Every power converter 200 includes control a circuit 201 with internal synchronization clock pulse oscillator 202 having a separate synchronization input. The external synchronization circuit 107 drives the multiple power converters 200 in the same way as described above for the power conversion system shown at FIG. 12.

FIG. 15 illustrates a modular DC-DC power conversion system configuration designed of multiple multi-channel DC-DC power converters similar to those shown at FIG. 14 and operated in clusterized poly-phased mode. The power-on cycles of internal power conversion channels 16 of every multi-channel DC-DC converter 12 are combined into poly-phased power-on clusters and the latters are further poly-phasely combined into totalized power draw. Therefore the clasterized poly-phase power sharing approach provides enhanced flexibility in developing sophisticate power conversion systems using standard power converting units both of mono- and poly-phase nature , and standard control devices.

CONCLUSION IN VIEW OF THE ABOVE DESCRIPTION

According to the method and system disclosed, the further advantages may therefore outflow evolving the following opportunities:

increasing the quantity of unitary power conversion channels within the power conversion systems beyond the limits persistent to the prior art;

increasing the converted power draw density within the power conversion systems beyond the limits persistent to the prior art;

increasing the quality of processed power beyond the limits persistent to the prior art;

increasing the rate-of-response to changes in load and to random interruptions within the power conversion systems beyond the limits persistent to the prior art;

reducing the overall size, weight and complexity of the power conversion systems beneath the limits persistent to the prior art;

promoting further standardization in manufacture through designing standardized power conversion elements of various performance capability and state-of-art down to the micro-chip level.

What is claimed is:

1. Method for power sharing conversion and regulation of the primary source power within the power converting and regulating supplies, comprised of the following steps:

subdividing every process of switch-mode power conversion and regulation into a number of less intensive power draw switch-mode sub-processes;

time-displacing the power-on cycles of the less intensive switch-mode sub-processes;

summing the portions of power converted through said less-intensive switch-mode sub-processes within the corresponding circuits; and wherein the improvement is comprised performing all three steps simultaneously and essentially within all and every common draw-paths of power conversion and regulation system.

2. Method according to claim 1, wherein the improvement is comprised of pre-selecting in accordance with pre-selected criteria the optimal value for N number of said sub-processes.

3. Method according to claim 2, wherein the improvement is comprised of pre-selecting in accordance with pre-selected criteria the optimal constant, N=const, value for N number of said sub-processes related to every successive process of switch mode power conversion and regulation.

4. Method according to claim 2, wherein the improvement is comprised of pre-selecting, in accordance with pre-selected criteria, the optimal value N=var value for N number of said sub-related to every successive process of switch-mode power conversion and regulation in accordance with pre-selected criteria.

5. Method according to claim 1, wherein the time-displacement $\Delta t_N$ exists between the start-on points of the said power-on cycles of the said sub-processes with respect to each other said sub-process, and wherein the improvement comprises the individual set-up for every on-going said time-displacement $\Delta t_N$ within the range of:

$$0 < \Delta t_N \leq T/N \qquad [1]$$

where T is the period of said power-on cycles of said sub-processes and N is the number of said sub-processes.

6. Method according to claim 1, wherein the improvement comprises the steps of:

pre-selecting in accordance with pre-selected criteria for the optimal value of M number of said sub-processes in respect to every successive process of switch-mode power conversion and regulation;

defining the value for Q number so, that:

$$Q = N/M; \qquad [2]$$

subdividing said N number of said sub-processes into said Q number of separate groups each containing said M number of said sub-processes;

combining in accordance with pre-selected criteria said M number of said sub-processes into a cluster within everyone of said Q number of said separate groups;

time-displacing the said power-on cycles of every said sub-process of said M number of said sub-processes combined into a cluster within everyone of said Q number of said separate groups with respect to each other said sub-process within the same said cluster of the same said separate group;

individually setting-up every on-going interrelated time-displacement $\Delta t_M$ between the start-on points of the successive said power-on cycles of every said sub-process of said M number of said sub-processes combined into a cluster within everyone of said Q number of said separate groups with respect to each other said sub-process within the same said cluster of the same said separate group within the range of:

$$0 < \Delta t_M \leq T/M; \quad [3]$$

combining all said power-on cycles of said M number of said sub-processes combined into a cluster within everyone of said Q number of said separate groups into a power-on cluster;

time-displacing the said Q number of separate said power-on clusters each containing said M number of clusterized power-on cycles of said M number of said sub-processes combined within every said cluster with respect to each other said power-on cluster;

individually setting-up every on-going time-displacement $\Delta t_N$ between the start-on points of the said power-on clusters of the clusterized power-on cycles of said M number of said sub-processes combined into a cluster within everyone of said Q number of said separate groups with respect to each other said power-on cluster within the range of:

$$0 < \Delta t_N \leq T/N.$$

7. Method according to claim 6, wherein the improvement comprises pre-selecting the optimal constant M=const value for M number of said sub-processes in respect to every successive process of switch-mode power conversion and regulation.

8. Method according to claim 6, wherein the improvement comprises pre-selecting the optimal value M=var for M number of said sub-processes in respect to every successive process of power conversion and regulation.

9. Method according to claim 1, wherein the improvement comprises the steps of:

pre-selecting in accordance with pre-selected criteria the optimal value for said M number of said sub-processes in respect of every successive process of switch-mode power conversion and regulation;

pre-selecting in accordance with pre-selected criteria the optimal value for said Q number of said groups in respect of every successive essential process of switch-mode power conversion and regulation;

defining the optimal value for said N number of said sub-processes in respect to every successive process of switch-mode power conversion and regulation so, that:

$$N=M*Q; \quad [4]$$

combining in accordance with pre-selected criteria said M number of said sub-processes into a cluster within everyone of said Q number of said separate groups;

time-displacing the said power-on cycles of every said sub-process of said M number of said sub-processes combined into a cluster within everyone of said Q number of said separate groups with respect to each other sub-process of the same said cluster of the same said separate group;

individually setting up every on-going interrelated time-displacement $\Delta t_M$ between the start-on points of the successive said power-on cycles of every said sub-process of of said separate groups with respect to each other said sub-process within the same said cluster of the same said separate group within the range of:

$$0 < \Delta t_M \leq T/M;$$

combining all said power-on cycles of said M number of said sub-processes into a cluster within everyone of said Q number of said separate groups into a power-on cluster;

time-displacing the said Q number of separate said power-on clusters each containing said M number of clusterized power-on cycles of said M number of said sub-processes combined into a cluster within everyone of said Q number of said separate groups with respect to each other said power-on cluster;

individually setting-up every on-going time-displacement $\Delta t_N$ between the start-on points of the said power-on clusters of the clusterized power-on cycles of said M number of said sub-processes combined into a cluster within everyone of said Q number of said separate groups within the range of:

$$0 < \Delta t_N \leq T/N.$$

10. Method according to claim 9, wherein the improvement is comprised of pre-selecting the optimal value M=const for M number of said sub-processes in respect to every successive process of switch-mode power conversion and regulation.

11. Method according to claim 9, wherein the-improvement is comprised of pre-selecting the optimal value M=var for M number of said sub-processes in respect to every successive process of switch-mode power conversion and regulation.

12. Method according to claim 9, wherein the improvement is comprised of pre-selecting the optimal value Q=const for Q number of said separate groups in respect to every successive process of switch-mode power conversion and regulation.

13. Method according to claim 9, wherein the improvement is comprised of pre-selecting the optimal value Q=var for Q number of said separate groups in respect of every successive process of switch-mode power conversion and regulation.

14. Method according to claim 1, wherein the improvement is comprised of the following steps:

pre-selecting in accordance with pre-selected criteria the optimal value for said Q number of said separate groups in respect to every successive process of switch-mode power conversion and regulation;

pre-selecting in accordance with pre-selected criteria the individual optimal value $M_q$=var for $M_q$ number of said sub-processes for everyone of Q number of said separate groups in respect to every successive process of power conversion and regulation;

defining the optimal value for N number of said sub-processes in respect to every successive process of power conversion and regulation so, that:

$$N=M_1+M_2+\ldots+M_Q=\Sigma M_q; \quad [5]$$

combining in accordance with pre-selected criteria every said individual $M_q$ number of said sub-processes into a cluster within every corresponding said separate group;

time-displacing the said power-on cycles of every said sub-process of said $M_q$ number of said sub-processes combined into a cluster within everyone of said Q number of said separate groups with respect to each other said sub-process within the same said cluster of the same said separate group;

individually setting-up every on-going time-displacement $\Delta t_{Mq}$ between the start-on points of the successive said power-on cycles of every said sub-process of said $M_q$ number of said sub-processes combined into a cluster within everyone of said Q number of said separate groups with respect to each other said sub-process within the same said cluster of the same said separate group within the range of:

$$0 < \Delta t_{Mq} \leq T/M_q; \quad [6]$$

combining all said power-on cycles of every said $M_q$ number of said sub-processes combined into a cluster within every said Q number of said separate groups into a power-on cluster;

time-displacing the said Q number of separate power-on clusters each containing said $M_q$ number of clusterized power-on cycles of said $M_q$ number of said sub-processes combined within every said cluster with respect to each other power-on cluster;

individually setting-up every on-going time-displacement $\Delta t_N$ between the start-on points of the said power-on clusters of the sub-grouped power-on cycles of said $M_q$ number of said sub-processes combined into a cluster within everyone of said Q number of said separate sub-groups within the range of:

$$0 < \Delta t_N \leq T/N$$

selecting the optimal value Q=const for Q number of said separate groups in respect of every successive process of switch-mode power conversion and regulation.

15. Method according to claim 14, wherein the improvement is comprised of pre-selecting the optimal value Q=var for Q number of said separate sub-groups in respect to every successive process of switch-mode power conversion and regulation.

16. Method according to claim 6, wherein the improvement is comprised of the step of summing the portions of power converted through said clusterized sub-processes into the power segments within said corresponding circuits.

17. Method according to claim 6, wherein the improvement is comprised of the equalizing of the corresponding electrical parameters of everyone of said M number of said sub-processes combined into a said cluster within a separate group with respect to corresponding electric parameters of all other said sub-processes combined within the same said cluster of the same said separate group.

18. Method according to claim 6, wherein the improvement is comprised of performing the said equalizing of the corresponding electrical parameters of said M number of said clusterized sub-processes within everyone of said Q number of said separate groups.

19. Method according to claim 17, wherein the improvement is comprised of pre-selecting the tolerance to which the said equalizing of the corresponding electrical parameters of said M number of said clusterized sub-processes should be performed.

20. Method according to claim 6, is comprised of the step of summing the portions of power converted through said sub-processes into the power segments within said corresponding circuits, wherein the improvement is comprised of summing the power segments that are the result of summing the portions of power converted through power-on clusters.

21. Method according to claim 6, wherein the improvement is comprised of the equalizing of the corresponding resultant electrical parameters of said power segments that are the result of summing the portions of power converted through power-on clusters.

22. Method according to claim 21, wherein the improvement is comprised of pre-selecting the tolerance to which the said equalizing of the resultant electrical parameters of the summed said power segments should be performed.

23. Method according to claim 9, wherein the improvement is comprised of the step of summing the portions of power converted through said clusterized sub-processes into the power segments within said corresponding circuits.

24. Method according to claim 9, wherein the improvement is comprised of the equalizing of the corresponding electrical parameters of everyone of said M number of said sub-processes combined into a said cluster within a separate group with respect to corresponding electrical parameters of all other said sub-processes combined within the same said cluster of the same said separate group.

25. Method according to claim 9, wherein the improvement comprises performing the said interrelative symmetrizing the corresponding electric parameters of said M number of said clusterized sub-processes within everyone of said Q number of said separate groups.

26. Method according to claim 24, wherein the improvement is comprised of pre-selecting the tolerance to which the said equalizing of the corresponding electrical parameters of said M number of said clusterized sub-processes should be performed.

27. Method according to claim 9, comprised of the steps of summing the portions of power converted through said sub-processes into the power segments within said corresponding circuits, wherein the improvement is comprised of summing the power segments that are the result of summing the portions of power converted through power-on clusters.

28. Method according to claim 9, wherein the improvement is comprised of the equalizing of the corresponding resultant electric parameters of said power segments that are the result of summing the portions of power converted through power-on clusters.

29. Method according to claim 28, wherein the improvement is comprised of pre-selecting the tolerance to which said equalizing the resultant electric parameters of the summed said power segments should be performed.

30. Method according to claim 14, wherein the improvement is comprised of the step of summing the portions of power converted through said clusterized sub-processes into the power segments within said corresponding circuits.

31. Method according to claim 14, wherein the improvement is comprised pf the equalizing the corresponding electrical parameters of everyone of said M number of said sub-processes combined into a said cluster within a separate group with respect to corresponding electrical parameters of all other said sub-processes combined within the same said cluster of the same said separate group.

32. Method according to claim 14, wherein the improvement is comprised of performing the said equalizing of the corresponding electrical parameters of said M number of said clusterized sub-processes within everyone of said Q number of said separate groups.

33. Method according to claim 31, wherein the improvement is comprised of pre-selecting the tolerance to which the said equalizing the corresponding electric parameters of said M number of said clusterized sub-processes should be performed.

34. Method according to claim 14, is comprised of the step of summing the portions of power converted through said sub-processes into the power segments within said corresponding circuits, wherein the improvement is comprised of summing the power segments resulted of summing the portions of power converted through power-on clusters.

35. Method according to claim 14, wherein the improvement is comprised of the equalizing of the corresponding resultant electrical parameters of said power segments that are the result of summing the portions of power converted through power-on clusters.

36. Method according to claim 35, wherein the improvement is comprised of pre-selecting the tolerance to which the said equalizing of the resultant electric parameters of the summed said power segments should be performed.

37. Method for clusterized power sharing switch-mode power conversion and regulation of a primary source power through a power supply system configuration comprised of one primary power source, at least one multi-channel DC-DC power converter and one load, wherein the improvement is comprised of performing the method according to claim 1 within the input circuitry of the said primary power source, within the input and output circuits of the said DC-DC power converter, within the input circuitry of the said load.

38. Method for switch-mode conversion and regulation of a primary source power through a power supply system configuration comprised of multiple primary power sources, multiple multi-channel DC-DC power converters and one load, wherein the improvement is comprised performing the method according to claim 1 within the output circuits of the said multiple primary power sources, within the input and output circuits of the said multiple DC-DC power converters, within the input circuitry of the said load.

39. Method for switch-mode conversion and regulation of a primary source power through a power supply system configuration comprised of one primary power source, multiple multi-channel DC-DC power converters and multiple loads, wherein the improvement is comprised of performing the method according to claim 1 within the output circuitry of said primary power source, within the input and output circuits of said multiple DC-DC power converters, within the input circuits of said multiple loads.

40. Method for switch-mode conversion and regulation of a primary power source through a power supply system configuration comprised of multiple primary sources, multiple multi-channel DC-DC power converters and multiple loads, wherein the improvement is comprised of performing the method according to claim 1 within the output circuits of said multiple primary power sources, within the input and output circuits of said multiple DC-DC power converters and within the input circuits of said multiple loads.

41. Power supply system configuration according to claim 37, wherein the improvement is comprised of including the means for summing the portions of power consumed from the primary power source by a multi-channel DC-DC power converter in a switch mode, and said the means to provide electrical compatibility between the output circuitry of the primary power source and input circuitry of the DC-DC power converter.

42. Power supply system configuration according to claim 37, wherein the improvement is comprised of including the means for summing the portions of power delivered to a load by a multi-channel DC-DC power converter, and said means to provide electrical compatibility between the output circuitry of the DC-DC converter and input circuitry of a load.

43. Power supply system configuration according to claim 37 comprised of:

at least one multi-channel DC-DC power converter comprised of:
multiple interconnected switch-mode DC-DC power conversion channels, each developed of any type of current of future topology, each processing a pre-selected portion of the entire amount of power being converted through the whole multi-channel DC-DC power converter within every process of switch-mode power conversion and regulation, each operating with the same conversion frequency period, with input circuits connected in series or in parallel to said primary DC power source and with output circuits connected in series or in parallel to said load, circuits comprised of a means for summing the portions of power converted through the switch-mode power conversion processes, said means provide electrical compatibility between the circuits they couple, control circuit comprising means for generating the synchronizing and operating signals for controlling the said power conversion channels, feedback circuitry comprising means for correcting the synchronizing and operating signals, wherein the improvement comprises the steps of;
subdividing in accordance with pre-selected criteria of said multiple switch-mode DC-DC power conversion channels into a number of separate groups each containing at least one said switch-mode DC-DC power conversion channel;
combining in accordance with pre-selected criteria said switch-mode DC-DC power conversion channels within said separate groups; time-displacing the power-on cycles every said switch-mode DC-DC power conversion channel with respect to each other said switch-mode DC-DC power conversion channel of the same said separate group;
time-displacing the clusters of power-on cycles of said switch-mode DC-DC power conversion channels combined within every said separate group with respect to each other said group;
summing the portions of power converted through everyone of said switch-mode DC-DC power conversion channel within the corresponding means.

44. Power supply system according to claim 37, wherein the improvement is comprised of a step of pre-selecting in accordance with pre-selected criteria a number of said switch-mode DC-DC power conversion channels combined within every said separate groups.

45. Power supply system configuration according to claim 37, is comprised of the total N number of said switch-mode DC-DC power conversion channels subdivided into Q number of said separate groups each containing $M_q$ number of said switch-mode DC-DC power conversion channels combined within, wherein the improvement is comprised of the steps:

individually setting-up every on-going time-displacement $\Delta t_{Mq}$ between the start-on points of the successive power-on cycles of every said switch-mode DC-DC power conversion channel combined within everyone of Q number of said separate groups with respect to each other, said switch-mode DC-DC power conversion channel of the same said group within the range of:

$$0 < \Delta t_{Mq} \leq T/M_q$$

where T is a period of said power-on cycles of power conversion within said DC-DC power conversion channels;

individually setting-up every on-going time-displacement $\Delta t_N$ between the start-on points of clusters of power-on cycles, i.e. power-on clusters of the in-group combined DC-DC power conversion channels, with respect to the other group clusters within the range of:

$$0 < \Delta t_N \leq T/N.$$

46. Power supply system according to claim 45, wherein the control circuit generates N number of operating signals with the time-displacement $\Delta t_N$ between the start-on points of the said operating signals, wherein the improvement is comprised of setting-up every on-going said time-displacement $\Delta t_N$ within the range of:

$$0 < t_N \leq T/N.$$

47. Power supply system configuration according to claim 46, wherein the improvement is comprised of distributing said N number of said operating signals in such specific order that time-displacement $\Delta t_{Mq}$ exists between the start-on points of said operating signals with respect to each other successive said operating signal applied to control the power-on cycles of everyone of said M number of DC-DC power conversion channels combined within the same said separate group and time-displacement $\Delta t_N$ exists between the start-on points of successive said operating signals applied to control the power-on clusters of said in-group combined DC-DC power conversion channels with respect to each other said separate group cluster.

48. Power supply system configuration according to claim 47, wherein the improvement is comprised of the steps:

setting-up said time-displacement $\Delta t_{Mq}$ within the range of:

$$0 < \Delta t_{Mq} \leq T/M_q$$

setting-up said time-displacement $\Delta t_N$ within the range of:

$$0 < \Delta t_N \leq T/N.$$

49. Power supply system configuration according to claim 43, where the improvement is that every said DC-DC power conversion channel contains the equalizing feed-back means correcting the synchronizing and operating signals in such a specific way that corresponding the electrical parameters of power conversion processes within said DC-DC power conversion channels are inter-equalized to pre-selected tolerances between said DC-DC power conversion channels combined into separate groups and in relation to every DC-DC power conversion channel combined within the same group.

50. Power supply system configuration according to claim 49, wherein the improvement is that every said separate group of said DC-DC power conversion channel contains the equalizing feed-back means correcting the synchronizing and operating signals in such a specific way that corresponding electrical parameters of power conversion processes within said DC-DC power conversion channels are inter-equalized to pre-selected tolerances between said separate groups and in relation to every said separate group.

51. Power supply system configuration according to claim 43, with a control circuit comprised of one common clock pulse generating circuit and Q number of synchronization circuits, each for $M_q$ number of DC-DC power conversion channels, wherein the improvement is that said common clock pulse generating circuit provides a clock pulse signal with a period of:

$$T_{Mq} = T/M_q,$$

said clock pulse signal is applied to the inputs of everyone of Q number of said synchronization circuits, everyone of said synchronization circuits generates a group of $M_q$ number of synchronizing signals with a period of:

$$T = T_{Mq} * M_q,$$

for corresponding $M_q$ number of in-grouped DC-DC power conversion channels, everyone of said synchronizing signals is time-displaced for an interval of:

$$T_{Mq} = T/M_q$$

with respect to each other successive said signal, said groups of $M_q$ number of synchronizing signals are time-displaced for an interval of:

$$0 < \Delta t_N \leq T/N$$

and are used for synchronizing the power-on cycles within said DC-DC power converters.

52. Power supply system configuration according to claim 43, is comprised of one primary DC power source, a multi-channel DC-DC power converter comprising N number of multiple DC-DC power conversion channels and one load, wherein the improvement is comprised of combining the output circuit of said primary DC power source together with the input circuits of said multi-channel DC-DC power converter and combining the output circuits of said multi-channel DC-DC power converter together with input circuit of said load in such a specific order that said combined circuits are common for N number of switch-mode power conversion processes performed within said multiple DC-DC power conversion channels.

53. Power supply system configuration according to claim 43, is comprised of a number of multiple primary DC power sources and one load, wherein the improvement comprises combining the output circuits of primary DC power sources together with input circuits of said multi-channel DC-DC power converter and combining the output circuits of said multichannel DC-DC power converter together with input circuitry of said load in such a specific order, that said combined circuits of said primary DC power sources and of said multi-channel DC-DC power converter are common for M number of switch-mode power conversion processes and input circuitry of the load is common for N number of switch-mode power conversion processes so that:

$$N = M * R,$$

where R is the number of multiple primary DC power sources.

54. Power supply system configuration according to claim 43, is comprised of one primary DC power source and a number of multiple loads, wherein the improvement comprises combining the output circuitry of the primary DC power source together with input circuits of said multi-channel DC-DC power converter and combining the output circuits of said multi-channel DC-DC power converter together with input circuits of said multiple loads in such a specific order that said combined circuits of primary DC power source and of said multi-channel DC-DC power converter are common for M number of switch-mode power conversion processes and said combined circuits of said multi-channel DC-DC power converter and of said multiple loads are common for N number of switch-mode power conversion processes so that:

$$N=M*P,$$

where P is the number of multiple loads.

55. Power supply system configuration according to claim 43, wherein the improvement is comprised of including the means for summing the portions of converted power, said means providing electrical compatibility to circuits they couple, into the said common combined circuits of primary power sources, of multi-channel DC-DC converters and of loads.

56. Power supply system configuration according to claim 43, wherein the improvement is that any multi-channel DC-DC power converter is comprised of multiple unitary switch-mode DC-DC power converters each of them comprising an internal power conversion channel together with internal control circuits incorporating the means for generating the internal synchronizing and operating signals.

57. Power supply system configuration according to claim 56, wherein the improvement is that everyone of said multiple unitary DC-DC power converters operates with a common operating frequency period.

58. Power supply system configuration according to claim 57, wherein the improvement is that input circuits of said multiple unitary switch-mode DC-DC power converters are connected in series or in parallel to said primary DC power sources and output circuits of said multiple unitary switch-mode DC-DC power converters are connected in series or in parallel to said loads.

59. Power supply system configuration according to claim 56, is comprised of a control circuit, wherein the improvement is that said control circuit comprises means for generating the internal clock pulse signal with a common frequency period together with means for generating the externally synchronized clock pulse signal, said means for generating the externally synchronized clock pulse signal have separate input for external synchronization.

\* \* \* \* \*